United States Patent
Yamaguchi

(10) Patent No.: US 9,455,770 B2
(45) Date of Patent: *Sep. 27, 2016

(54) INDUCTIVE-COUPLING SYSTEM AND METHOD WITH COMPENSATION TO PREVENT INTERFERENCE

(71) Applicant: Renesas Electronics Corporation, Kawasaki-shi, Kanagawa (JP)

(72) Inventor: Kouichi Yamaguchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/719,378

(22) Filed: May 22, 2015

(65) Prior Publication Data

US 2015/0256230 A1 Sep. 10, 2015

Related U.S. Application Data

(63) Continuation of application No. 13/352,141, filed on Jan. 17, 2012, now Pat. No. 9,071,288.

(30) Foreign Application Priority Data

Jan. 17, 2011 (JP) .................. 2011-006830
Dec. 15, 2011 (JP) .................. 2011-274216

(51) Int. Cl.
*H04B 5/00* (2006.01)
*H04B 1/034* (2006.01)
(Continued)

(52) U.S. Cl.
CPC .......... *H04B 5/0081* (2013.01); *H04B 1/034* (2013.01); *H04B 5/0031* (2013.01); *H04L 25/0266* (2013.01); *H04L 25/08* (2013.01);

(Continued)

(58) Field of Classification Search
CPC .......... H01L 2224/32145; H01L 2224/48145; H01L 2224/73265
See application file for complete search history.

(56) References Cited

U.S. PATENT DOCUMENTS

| | | | |
|---|---|---|---|
| 2008/0304557 A1* | 12/2008 | Hollis | ............... H04L 25/03885 375/231 |
| 2009/0273418 A1 | 11/2009 | Shimizu et al. | |
| 2010/0197349 A1 | 8/2010 | Morita et al. | |

(Continued)

OTHER PUBLICATIONS

Noriyuki Miura et al., "A 1 Tb/s 3 W Inductive-Coupling Transceiver for 3D-Stacked Inter-Chip Clock and Data Link", IEEE Journal of Solid-State Circuits, Jan. 2007, pp. 111-122, vol. 42, No. 1.

(Continued)

*Primary Examiner* — Ross Varndell
(74) *Attorney, Agent, or Firm* — Sughrue Mion, PLLC

(57) ABSTRACT

In a related transmitting circuit employing electromagnetic induction that is used in a communication system, there is a problem in that, because only one inductor is used in the transmitting circuit, it is impossible to perform communication at a data rate higher than the self-resonant frequency of the inductor. A transmitting circuit according to an embodiment of the present invention is a transmitting circuit that drives an inductor to transmit data to a semiconductor chip insulated from a semiconductor chip on which the transmitting circuit is mounted, and includes a driving circuit that receives outgoing data transmitted at a data rate higher than the self-resonant frequency of the inductor and outputs an outgoing signal that drives the inductor at the data rate of the outgoing data.

9 Claims, 27 Drawing Sheets

(51) Int. Cl.
 H04L 25/08 (2006.01)
 H04L 25/02 (2006.01)
(52) U.S. Cl.
 CPC ........... *H01L2224/32145* (2013.01); *H01L 2224/48145* (2013.01); *H01L 2224/73265* (2013.01)

(56) References Cited

U.S. PATENT DOCUMENTS

2011/0111695 A1* 5/2011 Shameli .............. H04L 27/02 455/41.1
2011/0115430 A1 5/2011 Saunamaki

OTHER PUBLICATIONS

Noriyuki Miura et al., "A 195-Gb/s 1.2-W Inductive Inter-Chip Wireless Superconnect With Transmit Power Control Scheme for 3-D-Stacked System in a Package", IEEE Journal of Solid-State Circuits, Jan. 2006, pp. 23-34, vol. 41, No. 1.

Noriyuki Miura et al., "A High-Speed Inductive-Coupling Link With Burst Transmission", IEEE Journal of Solid-State Circuits, Mar. 2009, pp. 947-955, vol. 44, No. 3.

Noriyuki Miura et al., "Analysis and Design of Inductive Coupling and Transceiver Circuit for Inductive Inter-Chip Wireless Superconnect", IEEE Journal of Solid-State Circuits, Apr. 2005, pp. 829-837 vol. 40, No. 4.

Shusuke Kawai et al., "A 2.5Gb/s/ch 4PAM Inductive-Coupling Transceiver for Non-Contact Memory Card", IEEE International Solid-State Circuits Conference Digest of Technical Papers, Feb. 9, 2010, pp. 264-266, Session 14/Non-Volatile Memory/14.5.

Miura, N.; Mizoguchi, D.; Inoue, M.; Sakurai, T., "A 195-gb/s 1.2-W inductive inter-chip wireless superconnet with transmit power control scheme for 3-D-stacked system in a package," Solid-State Circuits, IEEE Journal of, vol. 41, No. 1, pp. 23, 34. Jan. 2006.

* cited by examiner

WITHOUT COMPENSATION PROCESSING

TIME

WITH COMPENSATION PROCESSING

TIME

INCOMING SIGNAL

INCOMING SIGNAL AFTER
COMPENSATION PROCESSING

INDUCTIVE-COUPLING SYSTEM AND METHOD WITH COMPENSATION TO PREVENT INTERFERENCE

CROSS-REFERENCE TO RELATED APPLICATIONS

This application is a Continuation of U.S. application Ser. No. 13/352,141, filed Jan. 17, 2012, which claims the benefit of priority from Japanese Patent Application No. 2011-6830 filed on Jan. 17, 2011 and Japanese Patent Application No. 2011-274216 filed on Dec. 15, 2011, which are incorporated herein by reference in their entirety.

BACKGROUND

The present invention relates to transmitting circuits, receiving circuits, and communication systems equipped therewith and more particularly to a transmitting circuit and a receiving circuit that transmit signals via transformers, and a communication system equipped with these circuits.

In recent years, a communication means that utilizes magnetic coupling of a transformer has become widely used as a short-range communication means. In the communication means that utilizes magnetic coupling, however, a transformer includes coils, and each coil has an inductor. Here, waveforms of pulses used for transmitting and receiving are distorted owing to self-resonances caused by the inductors. As a result, in a communication means that utilizes magnetic coupling, it is necessary that the reciprocal of a pulse transmission duration (referred to as a data rate hereinafter) is limited up to about a third of the self-resonant frequencies of the inductors.

On the other hand, there is a need for the increase of communication speed even in the short-range communication. Therefore, technologies that increase the communication speed in the communication systems that utilize magnetic coupling are disclosed in Non-patent documents 1 to 5. A technology in which a communication speed is improved by installing plural transformers and parallelizing outgoing and incoming signals is disclosed in Non-patent document 1.

[Non-Patent Document 1]
N. Miura, D. Mizoguchi, M. Inoue, K. Niitsu, Y. Nakagawa, M. Tago, M. Fukaishi, T. Sakurai, and T. Kuroda, "A 1 Tb/s 3 W inductive-coupling transceiver for 3D-stacked inter-chip clock and data link", IEEE Journal of Solid-State Circuits, vol. 42, 2007, pp. 111-122

[Non-Patent Document 2]
N. Miura, D. Mizoguchi, M. Inoue, T. Sakurai, and T. Kuroda, "A 195-Gb/s 1.2-W inductive inter-chip wireless superconnect with transmit power control scheme for 3-D-stacked system in a package", IEEE Journal of Solid-State Circuits, vol. 41, 2006, p. 23

[Non-Patent Document 3]
N. Miura, D. Mizoguchi, T. Sakurai, and T. Kuroda, "Analysis and design of inductive coupling and transceiver circuit for inductive inter-chip wireless superconnect", IEEE Journal of Solid-State Circuits, vol. 40, 2005, p. 829

[Non-Patent Document 4]
S. Kawai, H. Ishikuro, and T. Kuroda, "A 2.5 Gb/s/ch 4PAM inductive-coupling transceiver for non-contact memory card", 2010 IEEE International Solid-State Circuits Conference Digest of Technical Papers (ISSCC), 2010, pp. 264-265

[Non-Patent Document 5]
N. Miura, Y. Kohama, Y. Sugimori, H. Ishikuro, T. Sakurai, and T. Kuroda, "A high-speed inductive-coupling link with burst transmission", IEEE Journal of Solid-State Circuits, vol. 44, no. 3, pp. 947-955, 2009.

SUMMARY

In reality, a transformer occupies a large circuit area or a mounting area. In the case of the above-cited Non-patent documents 1 to 5, plural transformers have to be installed, which results in a problem in that it becomes difficult to downsize the relevant apparatus or to reduce the cost of the apparatus.

A transmitting circuit according to an aspect of the present invention is a transmitting circuit for transmitting data with the use of electromagnetic induction generated by driving an inductor, including a driving circuit that receives outgoing data whose data rate is higher than the self-resonant frequency of the inductor, and outputs an outgoing signal that drives the inductor at the data rate of the outgoing data.

A receiving circuit according to another aspect of the present invention is a receiving circuit for receiving an outgoing signal generated by electromagnetic induction with the use of an inductor, including a determination circuit that outputs incoming data at a data rate higher than the self-resonant frequency of the inductor after determining a logic level of the outgoing data from an incoming signal.

A communication system according to still another aspect of the present invention includes: a transmission line that includes a first inductor and a second inductor that are electromagnetically coupled with each other; a driving circuit that drives the first inductor on the basis of incoming data; and a determination circuit that generates incoming data on the basis of an incoming signal input via the second inductor, wherein the driving circuit and the determination circuit transmit the outgoing data at a data rate higher than the self-resonant frequencies of the first and second inductors.

A transmitting circuit, a receiving circuit, and a communication system equipped with these circuits according to the aspects of the present invention transmit and receive signals at a data rate higher than the self-resonant frequencies of inductors. As a result, in the communication system equipped with the transmitting circuit and the receiving circuit according to the embodiment of the present invention, the communication speed of the communication processing performed via a transformer can be improved.

With the use of a transmitting circuit, a receiving circuit, and a communication system equipped with these circuits according to the aspects of the present invention, short-range communication by use of circuits that occupies small circuit areas or mounting areas can be performed at a high data rate.

DETAILED DESCRIPTION

First Embodiment

Figure 1:
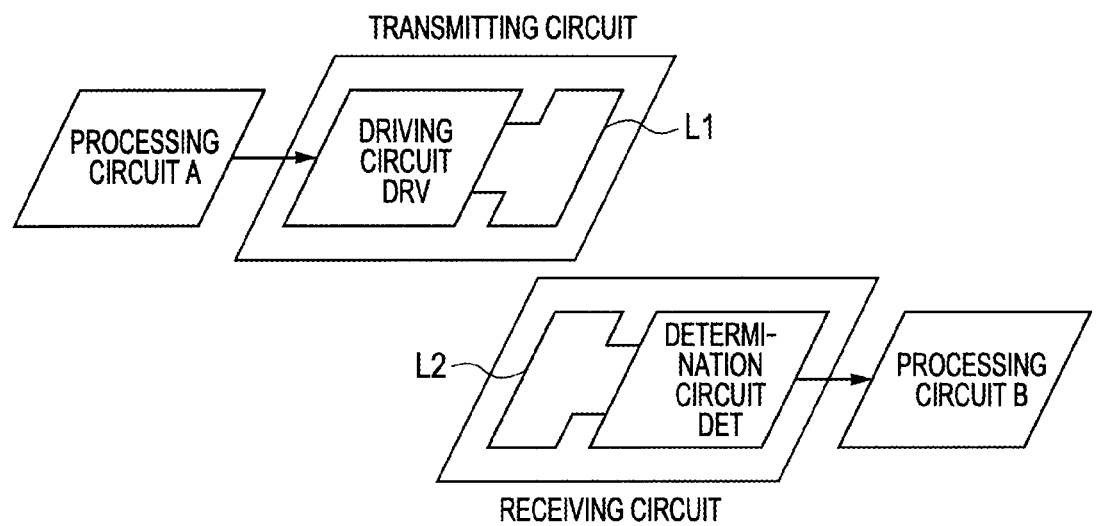
FIG. 1 is a block diagram showing a communication system according to an embodiment of the present invention.

A first embodiment of the present invention will be described with reference to the attached drawings. First, a communication system according to the first embodiment of the present invention will be described. FIG. 1 is a block diagram showing a communication system according to the first embodiment of the present invention. As shown in FIG. 1, the communication system according to the first embodiment includes a transformer, a transmitting circuit and a receiving circuit. In addition, a processing circuit A that supplies outgoing data to the transmitting circuit and a processing circuit B that receives incoming data output by the receiving circuit and performs a predetermined process on the received incoming data are depicted in FIG. 1. In the communication system according to this embodiment, communication between the transmitting circuit formed on a first semiconductor substrate and the receiving circuit formed on a second semiconductor substrate is performed through a transformer including two coils that individually include inductors L1 and L2, in which the first semiconductor substrate and the second semiconductor substrate are electrically insulated from each other. In other words, this transformer works as a transmission route between the transmitting circuit and the receiving circuit.

The transmitting circuit includes a driving circuit DRV. The DRV drives an inductor L1 so that the inductor generates electromagnetic induction. The driving circuit DRV receives the outgoing data at a data rate is higher than a self-resonant frequency of the inductor, and outputs an outgoing signal that drives the inductor L1 at the data rate of the outgoing data. Here, the processing circuit A outputs the outgoing data at a data rate higher than a self-resonant frequency of the inductor L1 to the driving circuit DRV.

The receiving circuit includes a determination circuit DET. The determination circuit DET outputs the incoming data at the data rate higher than the self-resonant frequency of an inductor L2 after determining a logic level of the outgoing data from an incoming signal. The processing circuit B performs predetermined processing on the basis of the incoming signal output by the determination circuit DET.

Figure 2:
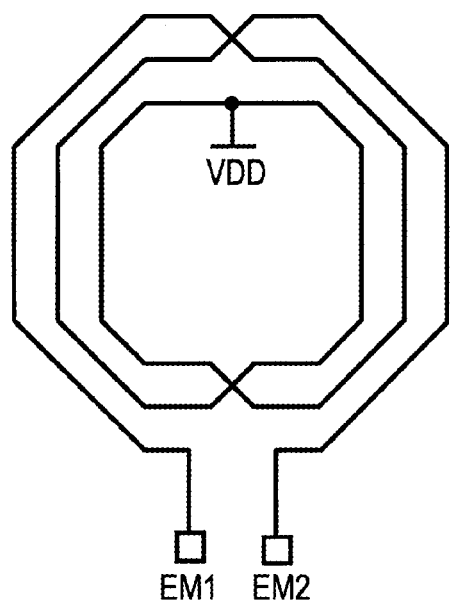
FIG. 2 is a schematic view of an inductor formed on a chip in the communication system shown in FIG. 1.

In an example configuration shown in FIG. 1, a transmitting circuit and a receiving circuit are respectively formed on semiconductor substrates separated from each other. In addition, the inductors L1 and L2 compose a transformer. In a configuration example shown in FIG. 1, the inductor L1 and the driving circuit DRV are formed on one substrate, and the inductor L2 and the determination circuit DET are formed on another substrate. A schematic view of a configuration of an inductor, such as the inductor L1 or the inductor L2, formed on a semiconductor substrate is shown in FIG. 2. As shown in FIG. 2, the inductor formed on the semiconductor substrate is formed by a polygonal wire, and the inductor is coupled at a near-middle point to a power terminal VDD. Terminals EM1 and EM2 to which the driving circuit DRV or the determination circuit DET is coupled are formed at both ends of the wire that composes the inductor. In the following description, it will be assumed that the inductor is driven by a differential signal, but an embodiment of the present invention can also be applied to a case where the inductor is driven by a single-ended signal.

In a related communication system that utilizes magnetic coupling, a data rate of outgoing data is limited by the self-resonant frequencies of inductors included by a transformer. On the other hand, in the communication system according to an embodiment of the present invention, communication, which uses magnetic coupling to transmit signals, can be performed at a data rate higher than self-resonant frequencies of inductors.

Therefore, the transmitting circuit of the communication system according to this embodiment of the present invention receives outgoing data whose data rate is higher than the self-resonant frequency of the inductor, and outputs an outgoing signal that drives the inductor at the data rate of the outgoing data. The receiving circuit outputs an incoming data at the data rate higher than the self-resonant frequency of the inductor after determining a logic level of the outgoing data from an incoming signal.

Figure 3:
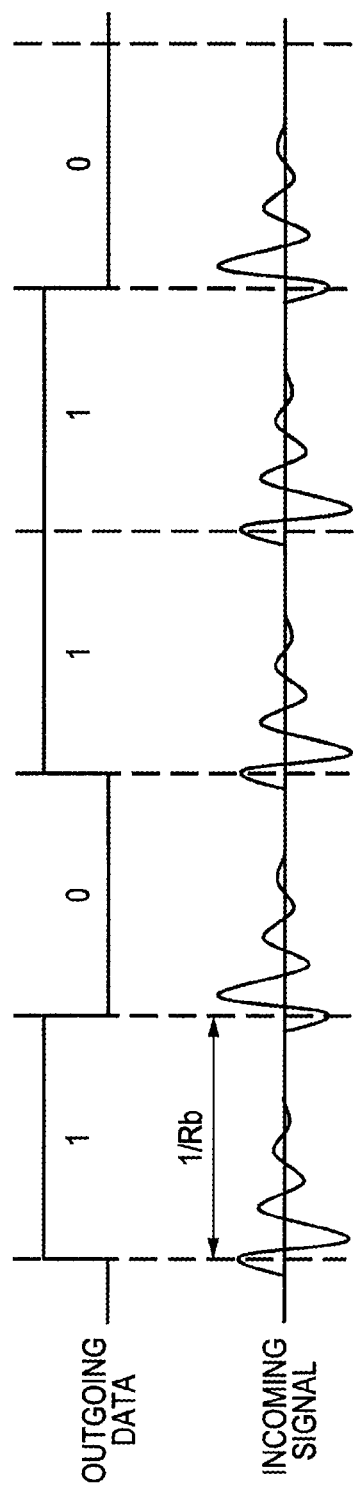
FIG. 3 is a diagram showing an example of a waveform of an outgoing signal of a transmitting circuit according to a first embodiment of the present invention.

Next, in a communication system that utilizes magnetic coupling, a relationship between a data rate Rb of outgoing data and an incoming signal generated across the inductor L2 owing to the outgoing data will be described below. FIG. 3 shows a waveform of outgoing data and an incoming signal corresponding to the outgoing data in a communication system that utilizes magnetic coupling. As shown in FIG. 3, in this communication system, a value 1 or a value 0 is treated as a data symbol, and the reciprocal of transmission duration of a data symbol becomes the data rate Rb. In FIG. 3, the reciprocal of transmission duration of a data symbol is the data rate Rb, and the waveform of the incoming signal has a large negative amplitude corresponding to an outgoing datum of the value 1, and has a large positive amplitude corresponding to an outgoing data piece of the value 0. Here, an amplitude is generated in the incoming signal corresponding to a front edge of each outgoing data piece, and the amplitude converges to zero in a predetermined time. This predetermined time is determined by a self-resonant frequency of the inductor L1 or the inductor L2.

Figure 4:
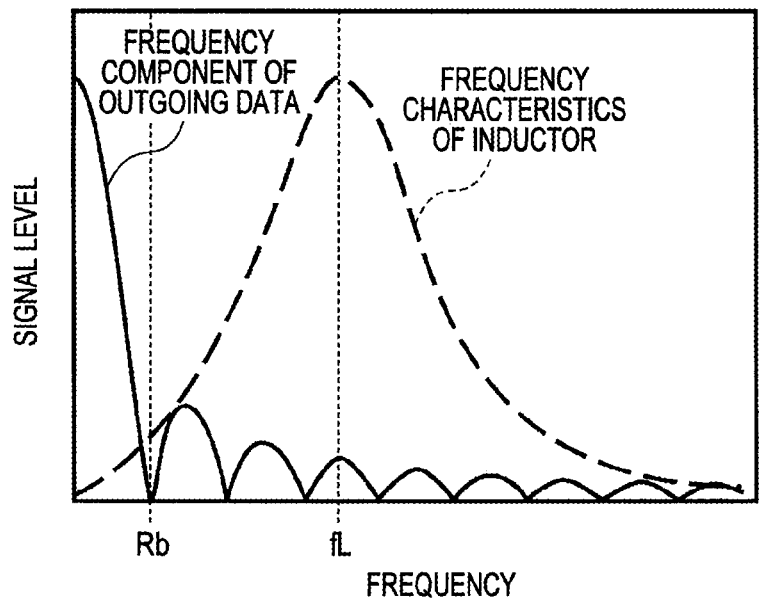
FIG. 4 is a graph showing frequency characteristics of a transmitting circuit according to a comparative example.

In a related communication system, in order to prevent occurrence of interference between data symbols owing to distortion of an incoming signal waveform, which is generated by the self-resonances of inductors L1 and L2, it is necessary that a data rate Rb is limited up to about a third of the self-resonant frequencies of the inductors L1 and L2. FIG. 4 is a graph showing the data rate Rb and the resonant frequency of the inductor L1 or the inductor L2 in the related communication system. As shown in FIG. 4, in the related communication system, in order to prevent occurrence of interference between data symbols, it is necessary that the data rate Rb is limited up to about a third of the self-resonant frequency of the inductor L1 or the inductor L2.

Figure 5:
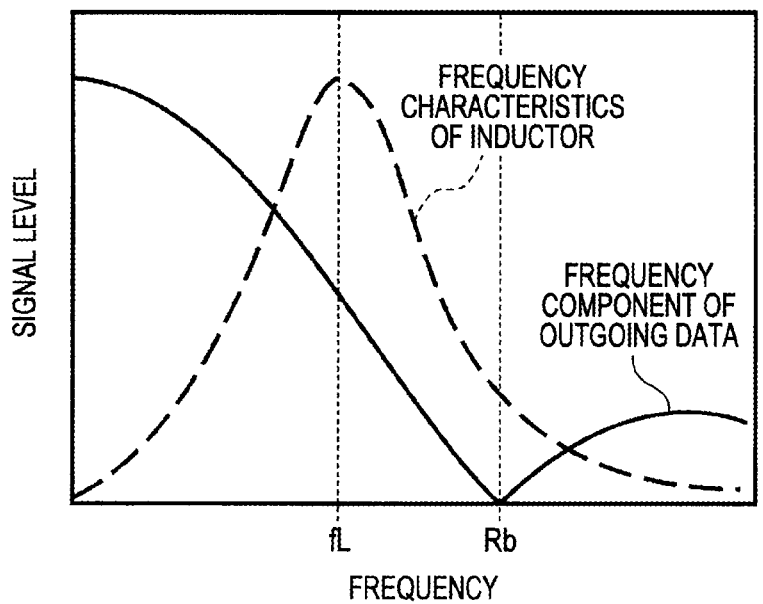
FIG. 5 is a graph showing frequency characteristics of the transmitting circuit according to the first embodiment.

On the other hand, FIG. 5 is a graph showing a data rate Rb and a resonant frequency of an inductor L1 or an inductor L2 in the communication system according to this embodiment of the present invention. As shown in FIG. 5, in the communication system according to this embodiment of the present invention, the data rate Rb is set higher than the self-resonant frequencies of the inductors L1 and L2.

In the communication system according to this embodiment of the present invention, outputting an outgoing signal to a transformer at a data rate higher than the resonant frequencies of the inductors L1 and L2 makes it possible that a high-speed communication equipped with circuits that occupy small circuit areas or mounting areas is performed without being subject to limitation owing to the resonant frequencies of the inductors L1 and L2.

As an alternative, a communication system can be realized so that its communication speed is made higher by making inductors included in a transformer have small radii to set self-resonant frequencies of the inductors high. In this case, however, there is a problem in that its communication area becomes small. On the other hand, in the communication system according to this embodiment of the present invention, the communication speed can be made high without being subject to limitation owing to the resonant frequencies of the inductors even if the radii of the inductors are made large. In other words, with the use of the communication system according to this embodiment of the present invention, a high-speed communication equipped with circuits that occupy small circuit areas or mounting areas can be realized.

In the communication system according to this embodiment of the present invention, transmitting and receiving signals are performed at a data rate higher than the self-resonant frequencies of inductors, which could lead to interference between data symbols. Therefore, in the communication system according to this embodiment of the present invention, it is desirable that, in at least one of the transmitting circuit and the receiving circuit, compensation processing is performed on an outgoing signal or an incoming signal in order to prevent the interference between data symbols from occurring. In the communication system according to this embodiment of the present invention, although the compensation processing can be performed on either of the transmitting circuit or the receiving circuit, it will be assumed that the compensation processing is performed on the transmitting circuit hereinafter in the first embodiment.

Figure 6:
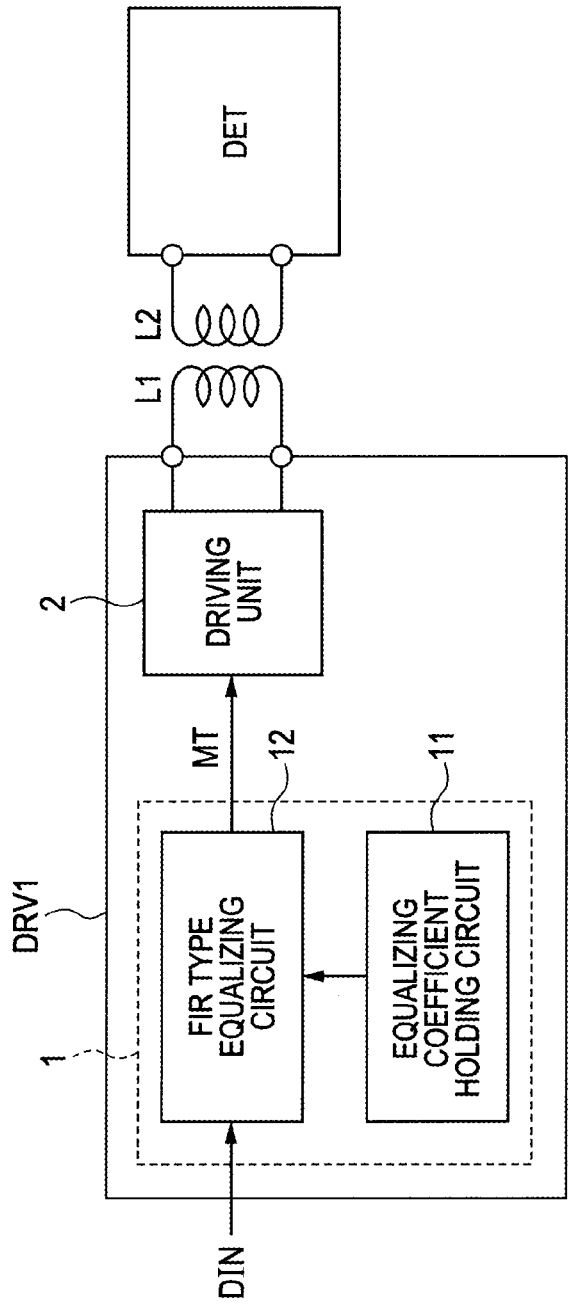
FIG. 6 is a block diagram of a driving circuit according to the first embodiment.

First, the compensation processing performed on the driving circuit DRV mounted on the transmitting circuit will be described in the first embodiment. A block diagram of a driving circuit DRV 1 according to the first embodiment is shown in FIG. 6. As shown in FIG. 6, the driving circuit DRV 1 includes an outgoing signal compensation unit 1 and a driving unit 12.

After receiving outgoing data DIN, the outgoing signal compensation unit 1 compensates distortion of a waveform of the outgoing data DIN caused by the self-resonances of the inductors L1 and L2, and outputs the compensated outgoing data to the driving unit 2. The outgoing signal compensation unit 1 performs the compensation processing at a data rate equivalent to a data rate of the outgoing data DIN. The compensation processing performed by the outgoing signal compensation unit 1 is performed by compensating the outgoing data DIN targeted for transmission with the use of n pieces of outgoing data respectively sent 1 cycle to n (wherein n represents a positive integer) cycles before the outgoing data DIN targeted for transmission is sent. To put it concretely, the following description will be made below. The outgoing signal compensation unit 1 includes an equalizing coefficient holding circuit 11 and an FIR type filter circuit. Here, because compensation processing by a function of an FIR type filter (for example, equalizing processing) is performed in the FIR type filter circuit, the FIR type filter circuit will be referred to as the FIR type equalizing circuit 12 hereinafter. The equalizing coefficient holding circuit 11 holds equalizing coefficients used in the FIR type equaling circuit 12. In the first embodiment, it will be assumed that these equalizing coefficients are set in advance.

The driving unit 2 drives the inductor L1 on the basis of the outgoing data compensated in the outgoing signal compensation unit 1. In the first embodiment, it will be assumed that the driving unit 2 drives the inductor L1 using a differential signal.

Figure 7:
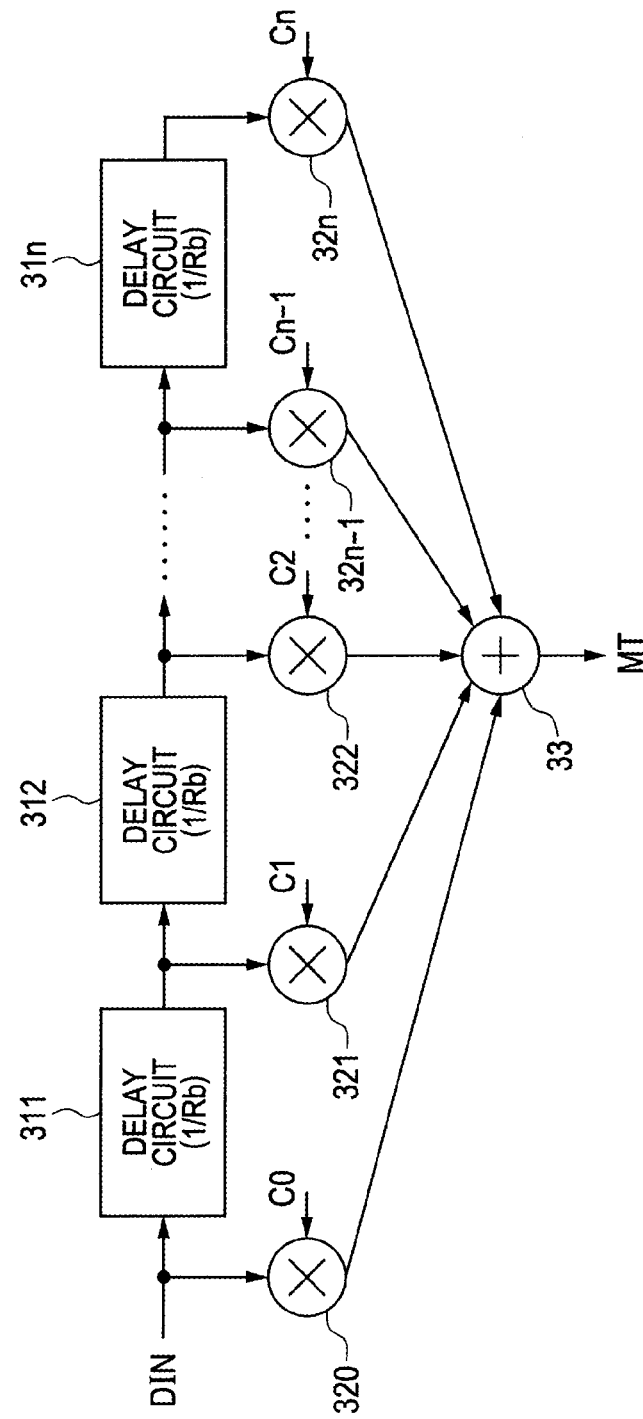
FIG. 7 is a conceptual diagram showing a processing principle of an outgoing signal compensation unit according to the first embodiment.

Next, a concrete explanation will be made about equalizing processing performed in the outgoing signal compensation unit 1. A processing principle of the equalizing processing performed in the outgoing signal compensation unit 1 is shown in FIG. 7. In FIG. 7, a concrete circuit is shown corresponding to each process necessary for the equalizing processing in order to explain the operational principle of the equalizing processing. As shown in FIG. 7, the equalizing processing performed in the outgoing signal compensation unit 1 can be realized with the use of delay circuits 311 to 31n, multipliers 320 to 32n, and an adder 33.

The delay circuits 311 to 31n are coupled in series. Each of the delay circuits 311 to 31n delays the outgoing data by a time period equal to a cycle corresponding to the data rate of the outgoing data DIN. Each of the delay circuits 311 to 31n−1 transmits the delayed outgoing data to its subsequent delay circuit, where the delay circuit 31n−1 is a delay circuit situated in front of the delay circuit 31n. The multiplier 310 multiplies the input outgoing data DIN by an equalizing coefficient C0, and outputs a multiplication product. The multipliers 321 to 32n respectively multiply the outgoing data output by the delay circuits 311 to 31n by equalizing coefficients C1 to Cn, and output multiplication products. The adder 33 adds the multiplication products output by the multipliers 320 to 32n to generate compensated outgoing data MT.

In other words, in the equalization processing, n pieces of outgoing data DIN are delayed, and the n pieces of outgoing data DIN for n cycles are parallelized. Subsequently, the parallelized n pieces of outgoing data DIN are respectively multiplied by the equalizing coefficient C0 to Cn in anti-chronological order. The compensated outgoing data MT is obtained by adding the n pieces of outgoing data DIN multiplied by the equalizing coefficient C0 to Cn.

The driving circuit DRV1 according to the first embodiment receives the outgoing data DIN as a digital signal, and current-drives the inductor L1 on the basis of the digital signal. Therefore, it is necessary that the driving circuit DRV1 outputs a current corresponding to the value given by the digital signal. In the driving circuit DRV1, a function for the equalizing processing and a function for driving the inductor L1 are realized by a circuit including the outgoing signal compensation unit 1 and the driving unit 2. A block diagram of the driving circuit DRV1 according to the first embodiment is shown in FIG. 8.

Figure 8:
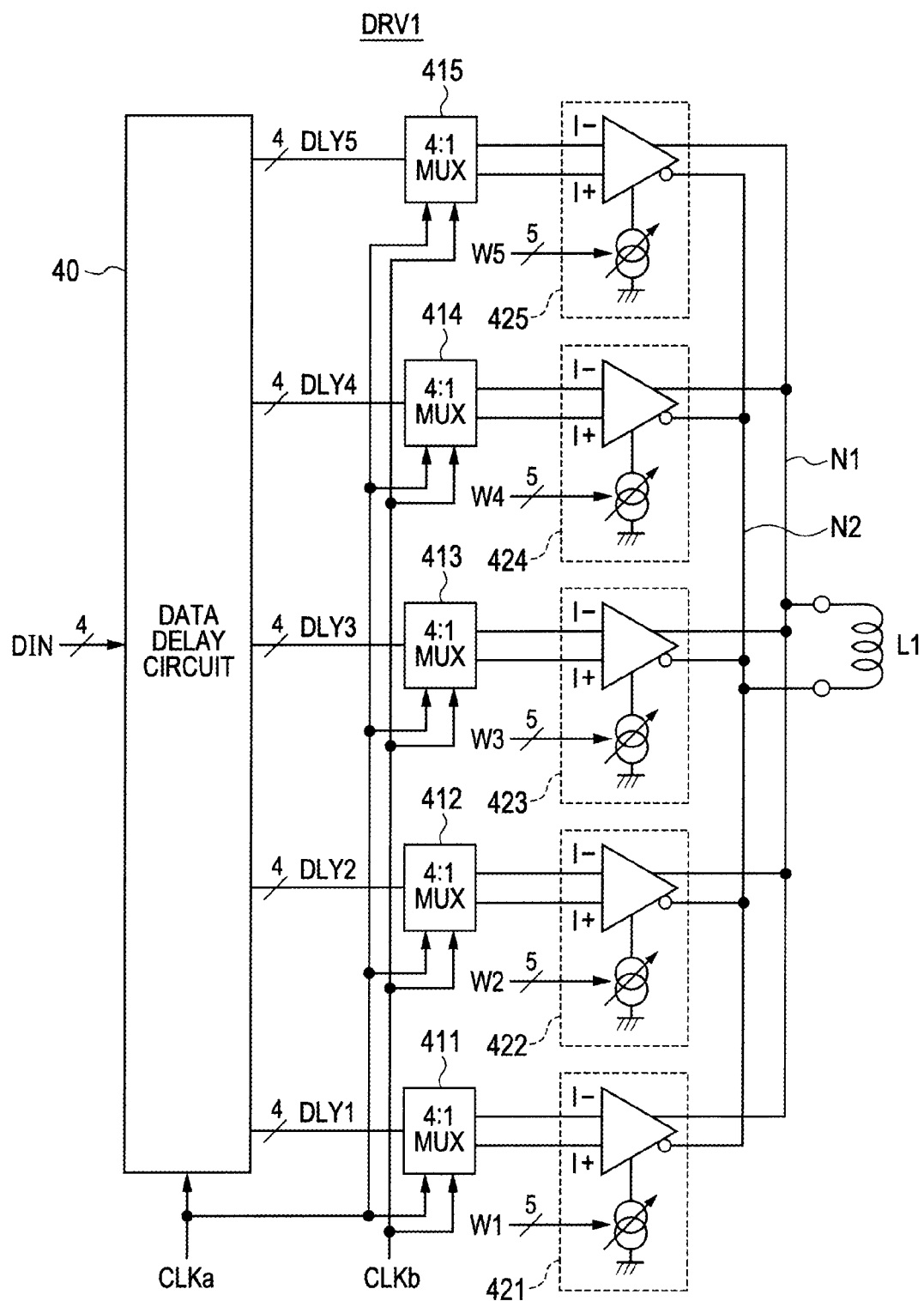
FIG. 8 is a block diagram of the driving circuit according to the first embodiment.

As shown in FIG. 8, the driving circuit DRV1 includes a data delay circuit 40, multiplexers 411 to 415 and outgoing signal output circuits 421 to 425. The driving circuit DRV1 shown in FIG. 8 is an example of a driving circuit that has four delay circuits shown in FIG. 7. In the first embodiment, it will be assumed that the outgoing data to be serially transmitted is parallelized in units of 4 bits, and input into the data delay circuit 40. A clock signal CLKa is input into the data delay circuit 40, and delayed data pieces DLY1 to DLY5, which are delayed in sync with the clock signal CLKa, are generated. Here, the clock signal CLKa has a frequency equal to one fourth of the data rate of the outgoing data DIN. In addition, the delayed data pieces DLY1 to DLY5 are respectively 4-bit signals. The data delay circuit 40 realizes a function equivalent to that of the delay circuits 311 to 31n shown in FIG. 7.

The delayed data pieces DLY1 to DLY5 are respectively input into the relevant multiplexers 411 to 415. In addition, the clock signal CLKa and a clock signal CLKb are input into the multiplexers 411 to 415. The clock signal CLKb has a frequency equal to one half of the data rate of the outgoing data DIN. The multiplexers 411 to 415 respectively load the delayed data pieces DLY1 to DLY5 in sync with the clock signal CLKa, and output data pieces that are comprised of the relevant delayed data on a bit-by-bit basis in sync with the clock signal CLKb. Here, the multiplexers 411 to 415 output a one-bit datum as a differential signal.

The outgoing signal output circuits 421 to 425 respectively drive the inductor L1 on the basis of the data output by the multiplexers 411 to 415. In addition, current control signals W1 to W5 are respectively input into the outgoing signal output circuits 421 to 425. The current control signals W1 to W5 are respectively 5-bit signals, and respectively adjust driving capabilities of the outgoing signal output circuits 421 to 425. These current control signals W1 to W5 are respectively signals having values equivalent to the equalizing coefficients C0 to C4. The outgoing signal output circuits 421 to 425 output differential signals. Here, output terminals of the same polarity of the outgoing signal output circuits 421 to 425 are coupled to each other at one node. In addition, the inductor L1 is coupled between the positive terminals, which are coupled to each other, and the negative terminals, which are coupled to each other, of the outgoing signal output circuits 421 to 425.

In other words, the function of the multipliers in FIG. 7 is realized by the outgoing signal output circuits 421 to 425. In addition, the function of the adder in FIG. 7 is realized by coupling output nodes of the same polarity of the outgoing signal output circuits 421 to 425.

Figure 9:
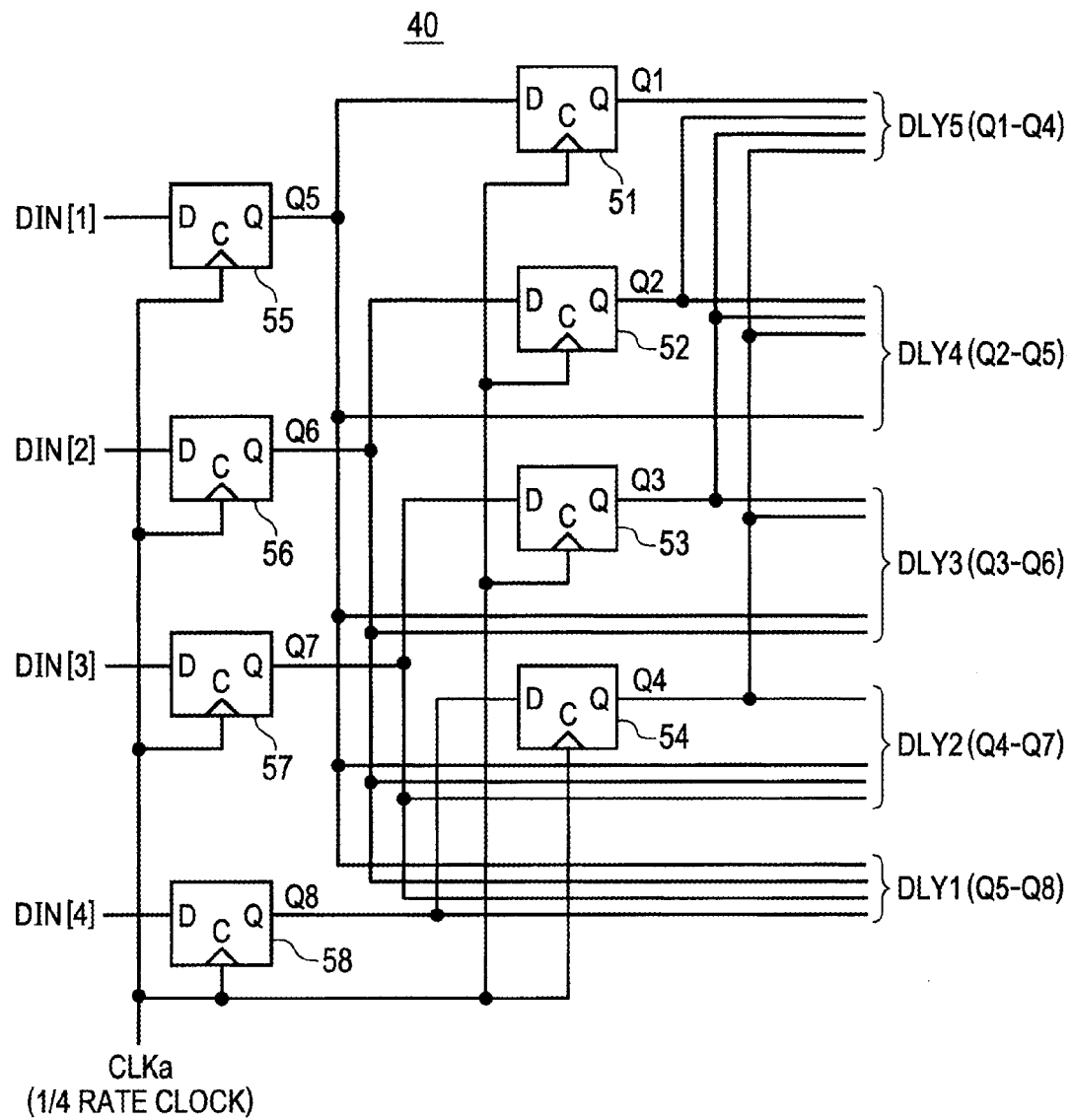
FIG. 9 is a block diagram of a data delay circuit according to the first embodiment.

Next, a concrete configuration of the data delay circuit 40 will be explained below. A block diagram of the data delay circuit 40 is shown in FIG. 9. As shown in FIG. 9, the data delay circuit 40 includes flip-flops 51 to 58. Each of the flip-flops 51 to 58 updates its holding value with a value input into an input terminal D, and outputs its holding value from an output terminal Q in sync with the clock signal CLKa. In FIG. 9, signals output from the flip-flops 51 to 58 are respectively given marks Q1 to Q8. As shown in FIG. 9, the flip-flops 55 to 58 respectively hold values of the outgoing data DIN[1] to DIN[4]. The flip-flops 51 to 54 respectively hold values of the signals Q5 to Q8 output from the flip-flops 55 to 58. In other words, the signal Q1 is an outgoing datum that is first transmitted in terms of time. The signals Q2 to Q8 are outgoing data transmitted following the signal Q1. In such a configuration, if the signal Q5 is outgoing data targeted for transmission, the outgoing data pieces of the signals Q1 to Q4 are used for compensating the signal Q5. If the signal Q6 is outgoing data targeted for transmission, the outgoing data pieces of the signals Q2 to Q5 are used for compensating the outgoing data Q6. If the signal Q7 is outgoing data targeted for transmission, the outgoing data pieces of the signals Q3 to Q6 are used for compensating the outgoing data Q7. If the signal Q8 is outgoing data targeted for transmission, the outgoing data pieces of the signals Q4 to Q7 are used for compensating the outgoing data Q8.

Figure 10:
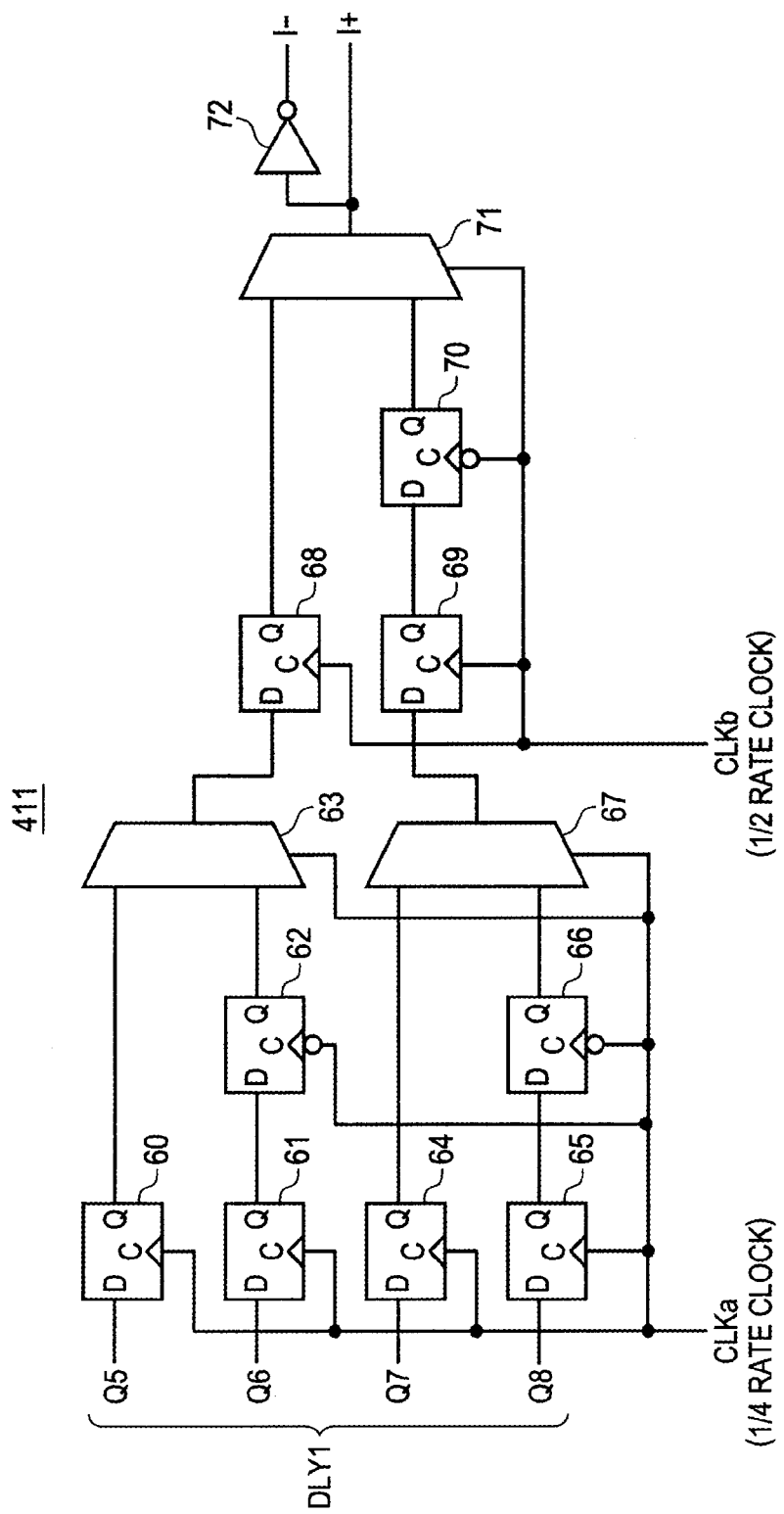
FIG. 10 is a block diagram of a multiplexer according to the first embodiment.

Next, a concrete configuration of the multiplexers 411 to 415 will be explained below. The multiplexers 411 to 415 have the same configuration, and therefore only the multiplexer 411 will be explained. FIG. 10 shows a block diagram of the multiplexer 411. As shown in FIG. 10, the multiplexer 411 includes flip-flops 60 to 62, flip-flops 64 to 66, flip-flops 68 to 70, selectors 63, 67 and 71, and an inverter 72. The multiplexer 411 is given the outgoing data pieces Q5 to Q8 as the delayed data DLY1.

The flip-flop 60 updates its holding value with a value given as the outgoing data piece Q5 in sync with the clock CLKa. The flip-flop 61 updates its holding value with a value given as the outgoing data piece Q6 in sync with the clock signal CLKa. The flip-flop 62 updates its holding value with a value of the outgoing data piece Q6 held by the flip-flop 61 in sync with the down edge of the clock signal CLKa. The selector 63 outputs one of the value held by the flip-flop 60 and the value held by the flip-flop 62 in accordance with the logic level of the clock signal CLKa. In other words, the selector 63 outputs the outgoing data pieces Q5 and Q6 in sequence in accordance with the logic level of the clock signal CLKa.

The flip-flop 64 updates its holding value with a value given as the outgoing data piece Q7 in sync with the clock CLKa. The flip-flop 65 updates its holding value with a value given as the outgoing data piece Q8 in sync with the clock signal CLKa. The flip-flop 66 updates its holding value with a value of the outgoing data piece Q8 held by the flip-flop 65 in sync with the down edge of the clock signal CLKa. The selector 67 outputs either the value held by the flip-flop 64 or the value held by the flip-flop 66 in accordance with the logic level of the clock signal CLKa. In other words, the selector 67 outputs the outgoing data pieces Q7 and Q8 in sequence in accordance with the logic level of the clock signal CLKa.

The flip-flop 68 updates its holding value with values of outgoing data pieces Q5 and Q6 output by the selector 63 in sequence in sync with the clock signal CLKb. The flip-flop 69 updates its holding value with values of outgoing data pieces Q7 and Q8 output by the selector 67 in sequence in sync with the clock signal CLKb. The flip-flop 70 updates its holding value with values of the outgoing data pieces Q7 and Q8 held by the flip-flop 69 in sequence in sync with the down edge of the clock signal CLKb. The selector 71 outputs one of the value held by the flip-flop 68 and the value held by the flip-flop 71 in accordance with the logic level of the clock signal CLKb. In other words, the selector 71 outputs the outgoing data piece Q5 to Q8 in sequence at the data rate of the outgoing data DIN.

The inverter 72 outputs an inversion signal of the outgoing data output by the selector 71. The data output by the selector 71 is sent to the noninverting input terminal of the outgoing signal output circuit 421 as a driving signal I+. The data output by the inverter 71 is sent to the inverting input terminal of the outgoing signal output circuit 421 as a driving signal I−.

Figure 11:
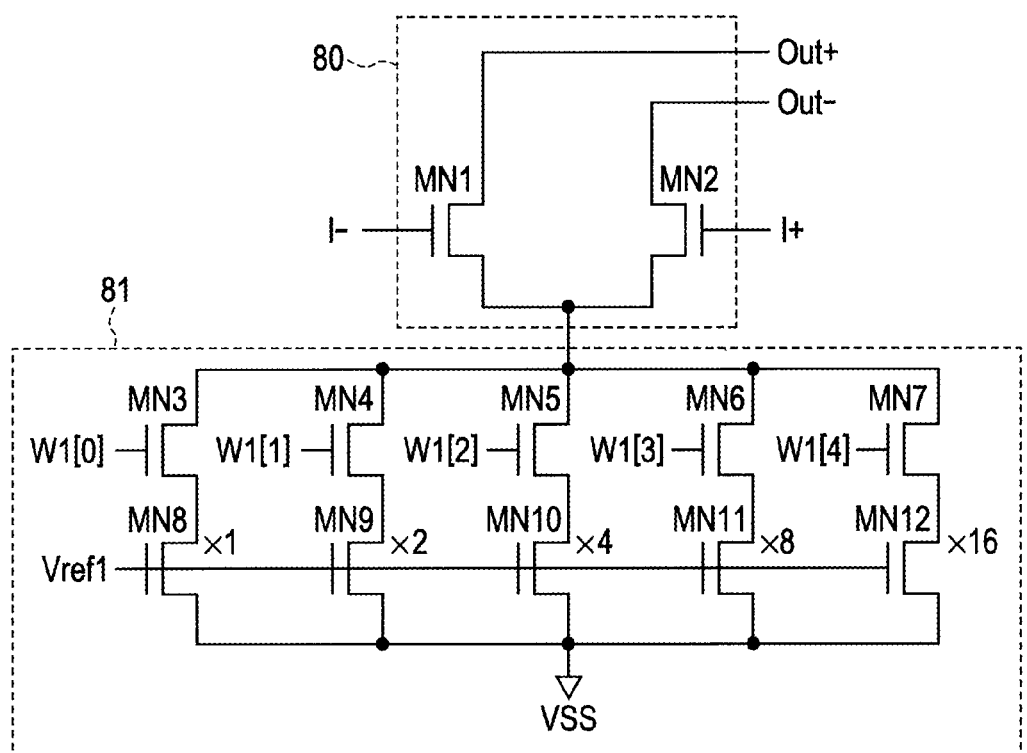
FIG. 11 is a block diagram of an outgoing signal output circuit according to the first embodiment.

Next, concrete configurations of the outgoing signal output circuit 421 to 425 will be explained below. The outgoing signal output circuit 421 to 425 have the same configuration, and therefore only the configuration of the outgoing signal output circuit 421 will be explained. FIG. 11 shows a circuit diagram of the outgoing signal output circuit 421. As shown in FIG. 11, the outgoing signal output circuit 421 includes a differential amplification unit 80 and a variable current source 81.

The differential amplification unit 80 includes a differential pair including transistors MN1 and MN2. The gate of the transistor MN1 is an inverting input terminal of the outgoing signal output circuit 421, and receives the driving signal I−. The drain of the transistor MN1 is coupled to a noninverting output terminal OUT+. The gate of the transistor MN2 is a noninverting input terminal of the outgoing signal output circuit 421, and receives the driving signal I+. The drain of the transistor MN2 is coupled to an inverting output terminal OUT−. The sources of the transistors MN1 and MN2 are coupled to each other, and the variable current source 81 supplies an operating current to the sources of the transistors MN1 and MN2.

The variable current source 81 outputs the operating current that varies its value from 1 time the reference current to 31 times the reference current in accordance with the value of the current control signal W1. This operating current is output as a driving current through the differential amplification unit 80. The variable current source 81 includes transistors MN3 to MN12. A reference voltage Vref1 is input into the gates of the transistors MN8 to MN12. The gate lengths of these transistors are of the same length, but the gate widths are different. For example, the gate length of the transistor MN8 is 1 times the reference gate length, and the transistor MN8 outputs 1 times the reference current. The gate length of the transistor MN9 is 2 times the gate length of the transistor MN8, and the transistor MN9 outputs 2 times the reference current. The gate length of the transistor MN10 is 4 times the reference gate length of the transistor MN8, and the transistor MN10 outputs 4 times the reference current. The gate length of the transistor MN11 is 8 times the reference gate length of the transistor MN8, and the transistor MN11 outputs 8 times the reference current. The gate length of the transistor MN12 is 16 times the reference gate length of the transistor MN8, and the transistor MN12 outputs 16 times the reference current. The sources of the transistors MN8 to MN12 are coupled to an earth terminal.

The transistors MN3 to MN7 respectively function as switches to set the transistors MN8 to MN12 on or off. The transistor MN3 is formed corresponding to the transistor MN8, and sets the transistor MN8 on or off in accordance with a current control signal W1[0]. The transistor MN4 is formed corresponding to the transistor MN9, and sets the transistor MN9 on or off in accordance with a current control signal W1[1]. The transistor MN5 is formed corresponding to the transistor MN10, and sets the transistor MN10 on or off in accordance with a current control signal W1[2]. The transistor MN6 is formed corresponding to the transistor MN11, and sets the transistor MN11 on or off in accordance with a current control signal W1[3]. The transistor MN7 is formed corresponding to the transistor MN12, and sets the transistor MN12 on or off in accordance with a current control signal W1[4]. In addition, the drains of the transistors MN3 to MN7 are coupled to each other, and these transistors supply an operating current to the differential amplification unit 80.

In other words, the outgoing signal output circuits 421 to 425 multiply the outgoing data DIN by the equalizing coefficients by adjusting an operating current given to the differential amplification unit 80 in accordance with values of the current control signals W1[0] to W1[4]. The outgoing signal output circuits 421 to 425 respectively output driving currents, and these driving currents are summed up at output nodes of the outgoing signal output circuit 421 to 425 to form a multiplication product.

Next, a driving circuit output by the driving circuit DRV1 and the incoming signal generated across the inductor L2 formed in the receiving circuit will be described below. The following description will be made about the driving current and the incoming signal in the case where the outgoing data DIN varies from "0", "1", to "0".

Figure 12:
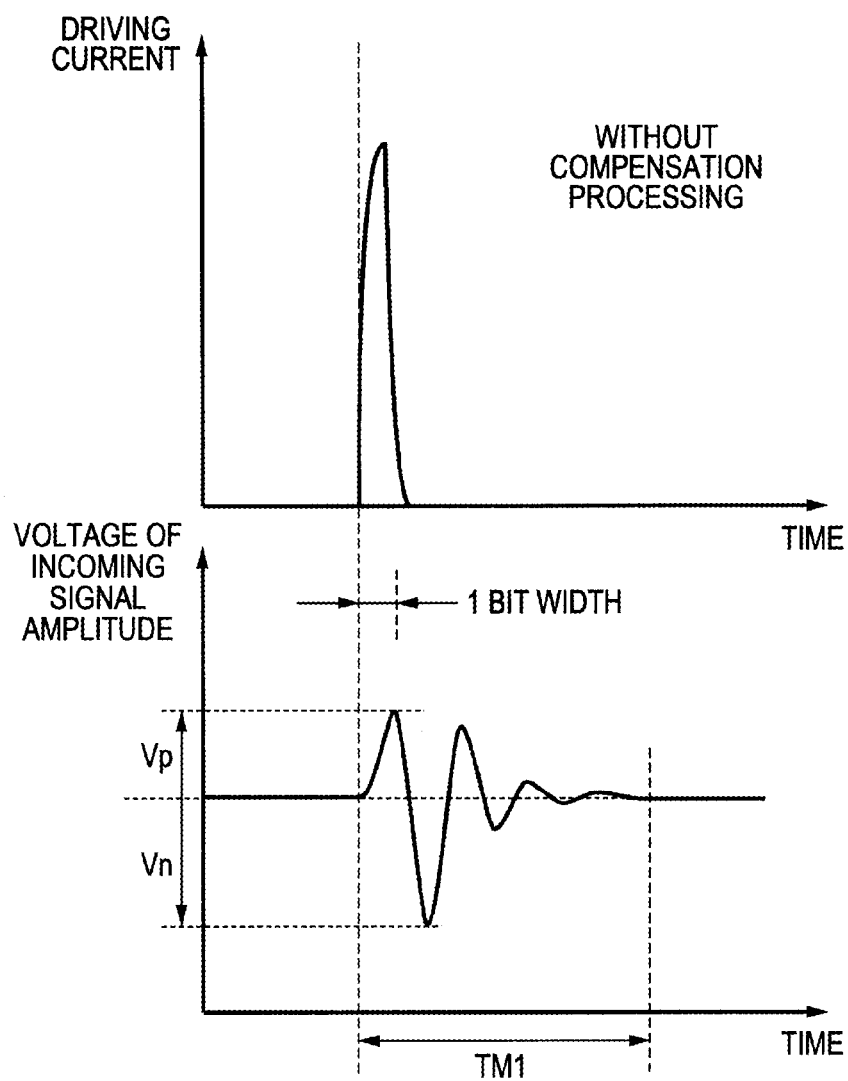
FIG. 12 is a diagram showing waveforms of an outgoing signal and an incoming signal in the case where compensation processing is not performed.

First, the relationship between the driving current and the incoming signal in the case where compensation processing is not performed by the driving circuit DRV1 according to the first embodiment is shown in FIG. 12. As shown in FIG. 12, in the case where the compensation processing is not performed, it takes a time period TM1 for the amplitude of an incoming signal generated by a pulse of the driving current generated in response to a value of an outgoing datum "1" to converge to zero. In addition, in FIG. 12, the width of a current pulse is equivalent to a time period of 1 bit of the outgoing data. In the FIG. 12, the time period TM1 is much longer than the width of the 1 bit. In addition, in FIG. 12, the maximum positive amplitude Vp of the incoming signal is smaller than the maximum negative amplitude Vn.

Figure 13:
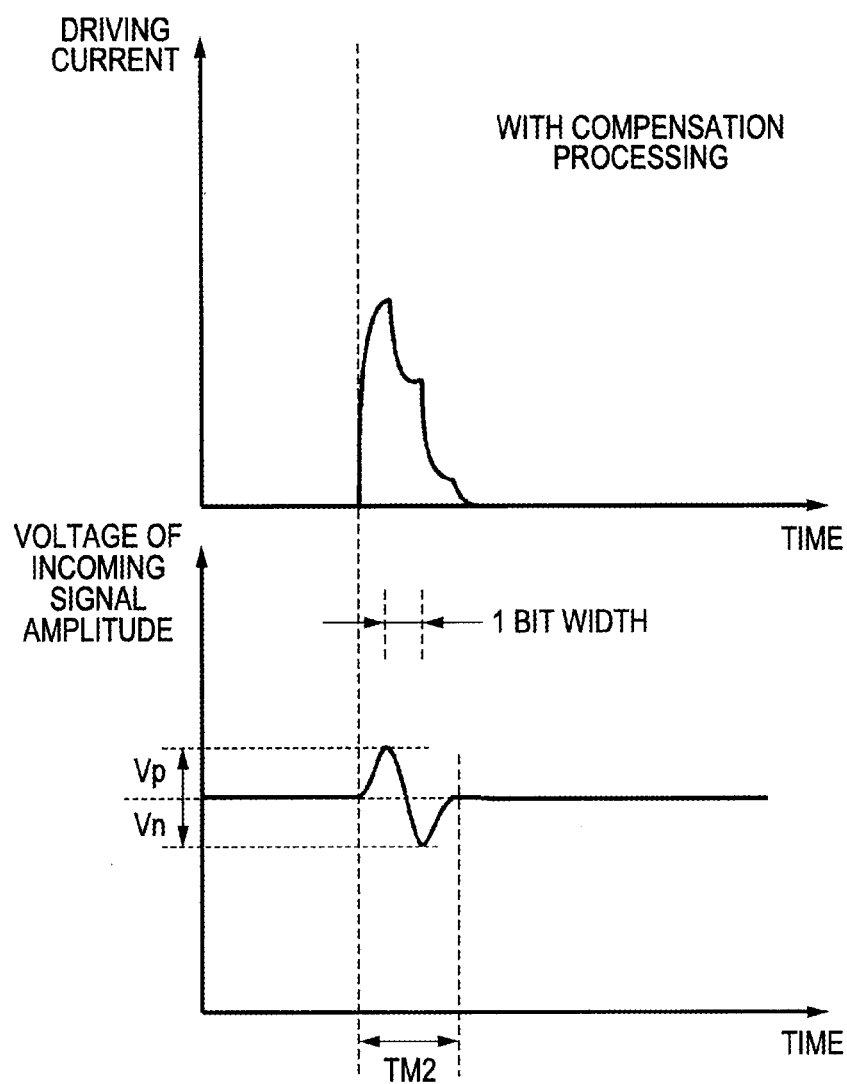
FIG. 13 is a diagram showing waveforms of an outgoing signal and an incoming signal in the case where compensation processing is performed with the use of FIR type equalizing processing.

On the other hand, the relationship between the driving current and the incoming signal in the case where compensation processing is performed by the driving circuit DRV1 according to the first embodiment is shown in FIG. 13. As shown in FIG. 13, in the case where the compensation processing is performed, it takes a time period TM2 for the amplitude of an incoming signal generated by a pulse of the driving current generated in response to a value of an outgoing datum "1" to converge to zero. In FIG. 13, the width of a current pulse in response to the value of an outgoing datum "1" is larger than a time period of 1 bit of the outgoing data owing to the compensation processing. On the other hand, in FIG. 13, the time period TM2 is about three times the width of the 1 bit. In addition, in FIG. 13, the maximum positive amplitude Vp of the incoming signal is almost equal to the maximum negative amplitude Vn. In other words, in the case where the compensation processing is performed, it takes a shorter time period for the waveform of an incoming signal generated in response to a value of an outgoing datum "1" to converge to zero, and at the same time the waveform of the incoming signal represents the data "0", "1", "−1" and "0". A signal like this incoming signal is referred to as a dicode signal.

Figure 14:
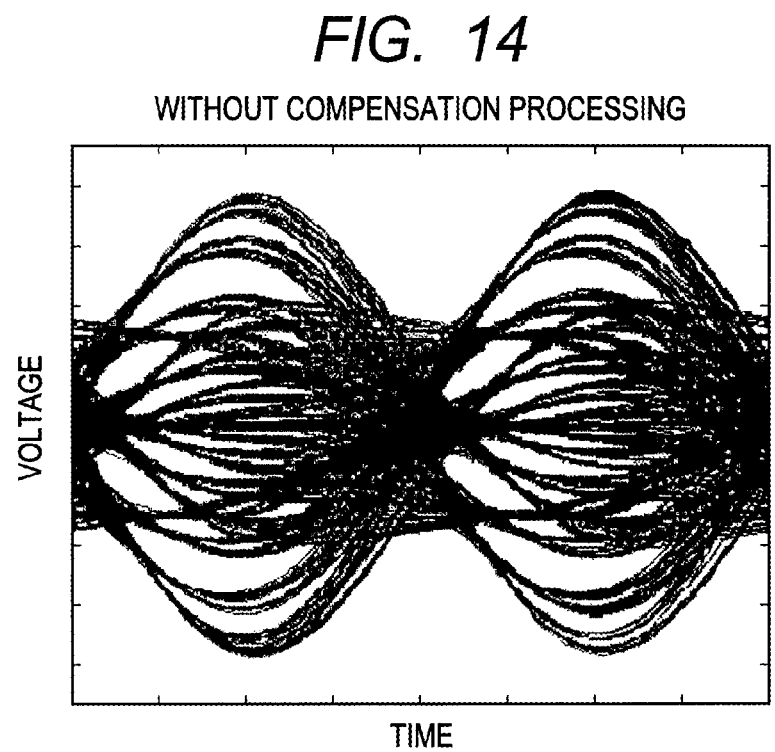
FIG. 14 is a diagram showing eye patterns of an incoming signal in the case where compensation processing is not performed.
Figure 15:
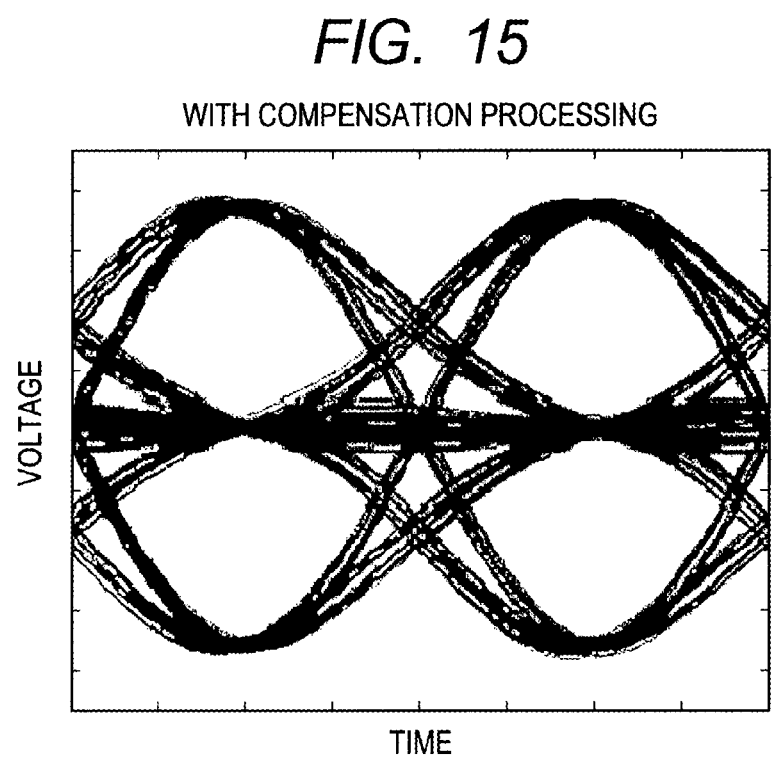
FIG. 15 is a diagram showing eye patterns of an incoming signal in the case where compensation processing is performed with the use of FIR type equalizing processing.

Next, the effect of the compensation processing will be explained with the use of eye patterns of an incoming signal. FIG. 14 shows eye patterns of an incoming signal in the case where the compensation processing is not performed. FIG. 15 shows eye patterns of an incoming signal in the case where the compensation processing is performed. The eye patterns shown in FIG. 14 and FIG. 15 are obtained from an incoming signal at one terminal of the inductor L2 formed in the receiving circuit.

The eye patterns in FIG. 14 are corrupted owing to the distortion of the waveform of the incoming signal. It is difficult for the determination circuit to determine the characteristics of such a signal. On the other hand, in FIG. 15, the distortion of the waveform of an incoming signal is compensated, and eye patterns becomes large, so that the level of the incoming signal can be easily determined. As shown in FIG. 15, the binary outgoing data becomes a three-valued incoming signal including "0", "1" and "−1" through the compensation performed by the driving circuit DRV1 according to the first embodiment. For example, outgoing data that is a bipolar sequence "−1", "1", "−1" and "−1" becomes an incoming signal that is a three-valued sequence "0", "1", "−1" and "0".

As described above, in the driving circuit DRV1 according to the first embodiment, the compensation processing performed with the use of FIR type equalizing processing makes it possible to shorten a time period needed for the convergence of an incoming signal. In addition, this compensation processing is performed at the data rate of outgoing data. Therefore, in the driving circuit DRV1 according to the first embodiment, even if outgoing data is transmitted at a data rate higher than the self-resonant frequencies of the inductors L1 and L2, it is possible that interference between a series of outgoing data is prevented and erroneous reception in the receiving circuit is prevented.

In addition, in the driving circuit DRV1 according to the first embodiment, because a clock signal which frequency is lower than the data rate of the outgoing data is used in the compensation processing, the power consumption for the compensation processing can be reduced.

Second Embodiment

Figure 16:
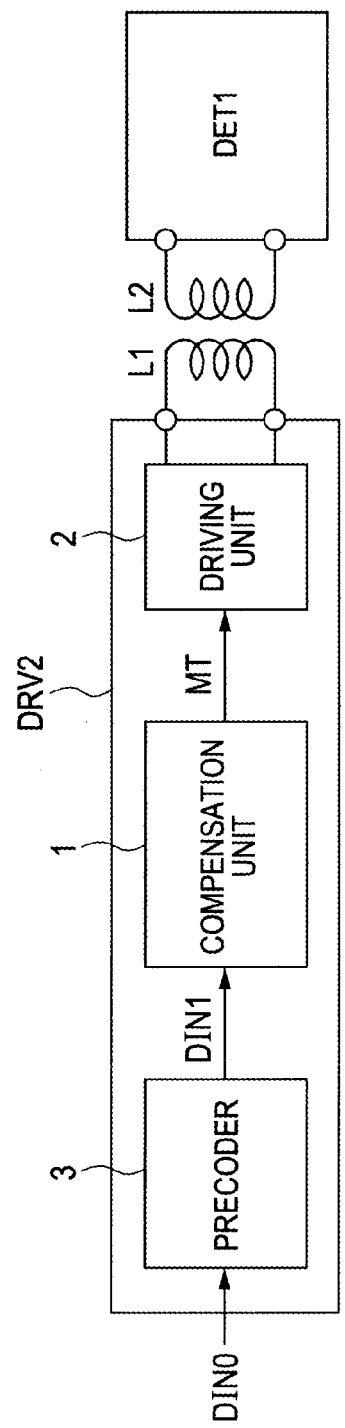
FIG. 16 is a block diagram of a driving circuit according to a second embodiment of the present invention.

In a second embodiment of the present invention, a driving circuit DRV2 that is a modification of the driving circuit DRV1 according to the first embodiment will be explained below. FIG. 16 is a block diagram of the driving circuit DRV2 according to the second embodiment. As shown in FIG. 16, the driving circuit DRV2 is a driving circuit that is equivalent to the driving circuit DRV1 to which a precoder 3 is added.

The precoder 3 is installed in front of a compensation unit 1, and modulates outgoing data DIN0 and sends outgoing data DIN1, which is the modulated outgoing data DIN0, to a compensation unit 1. The outgoing data DIN is sent to a determination circuit DET1 via a predetermined transfer function that is determined by the compensation unit 1, a driving unit 2, inductors L1 and L2, and the like. The precoder 3 is a transfer function that cancels the effect of the predetermined transfer function, and modulates the outgoing data DIN0 with the use of its transfer function to generate the outgoing data DIN1.

Figure 17:
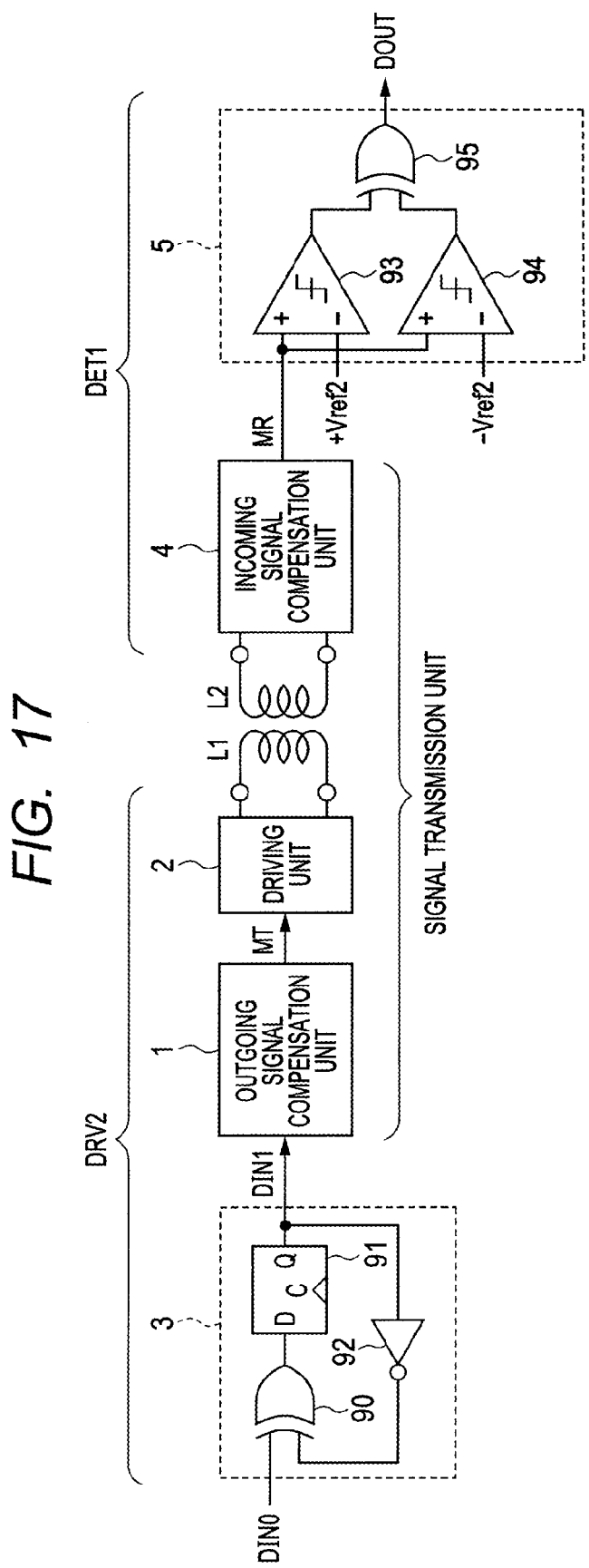
FIG. 17 is a diagram for explaining a precoder according to the second embodiment.

Here, a concrete example of the precoder 3 will be described. FIG. 17 is a block diagram for explaining the configuration of the precoder 3. In the example shown in FIG. 17, the outgoing data DIN0 is modulated by the precoder 3, and the modulated outgoing data DIN0 goes through the compensation unit 1, the driving unit 2, the inductors L1 and L2, an incoming signal compensation unit 4 and a determination unit 5, and is output as the incoming data DOUT. In the example shown in FIG. 17, it will be assumed that a combination of the compensation unit 1, the driving unit 2, the inductors L1 and L2, and the incoming signal compensation unit 4 is called as a signal transmission unit. In addition, it will be assumed that the transfer function of this signal transmission unit is 1-D. Here, D is a delay corresponding to the width of 1 bit. In addition, it will be assumed that the transfer function of the determination unit 5 is modulo 2. In addition, it will be assumed that the precoder 3 shown in FIG. 17 has a transfer function represented by expression (1) in order to cancel the effect of the transfer function 1-D of the signal transmission unit and the transfer function of the determination unit 5.

[Expression 1]

$$\left[\frac{1}{1-D}\right]_{mod2} \tag{1}$$

This precoder 3 includes an exclusive OR circuit 90, a flip-flop 91 and an inverter 92. The exclusive OR circuit 90 outputs the result of the exclusive OR operation of the outgoing data DIN0 and the inversion signal of the modulated outgoing data DIN1. The flip-flop 91 updates its holding value with the output value of the exclusive OR circuit 90 in sync with a clock signal that has the same frequency as the data rate. In addition, the output value of the flip-flop 91 becomes the modulated outgoing data DIN1.

The modulated outgoing data DIN1 is inverted by the inverter 92, and given to the exclusive OR circuit 90.

FIG. 17 shows an example of the determination unit 5. The determination unit 5 includes comparators 93 and 94, and an exclusive OR circuit 95. A reference voltage +Vref2 is input into the inverting input terminal of the comparator 93, and an incoming signal MR that is compensated by the incoming signal compensation unit 4 is input into the noninverting input terminal. A reference voltage −Vref2 is input into the inverting input terminal of the comparator 94, and the incoming signal MR that is compensated by the incoming signal compensation unit 4 is input into the noninverting input terminal. Output signals of comparators 93 and 94 are respectively input into two input terminal of the exclusive OR circuit 95. The determination unit 5 with the above-described configuration functions as a circuit that performs modulo 2 on a three-valued signal including "1", "0" and "−1".

In the driving circuit DRV2 according to the second embodiment, the precoder 3 cancels the effect of the transfer functions of the signal transmission unit and the determination unit. The cancellation of the effect of the transfer functions of the signal transmission route makes it possible that the incoming data is generated by a simple circuit. In addition, the cancellation of the effect of the transfer functions of the signal transmission route makes it possible that the correlation ship between the incoming data DOUT and the outgoing data DIN1 is strengthened.

Third Embodiment

Figure 18:
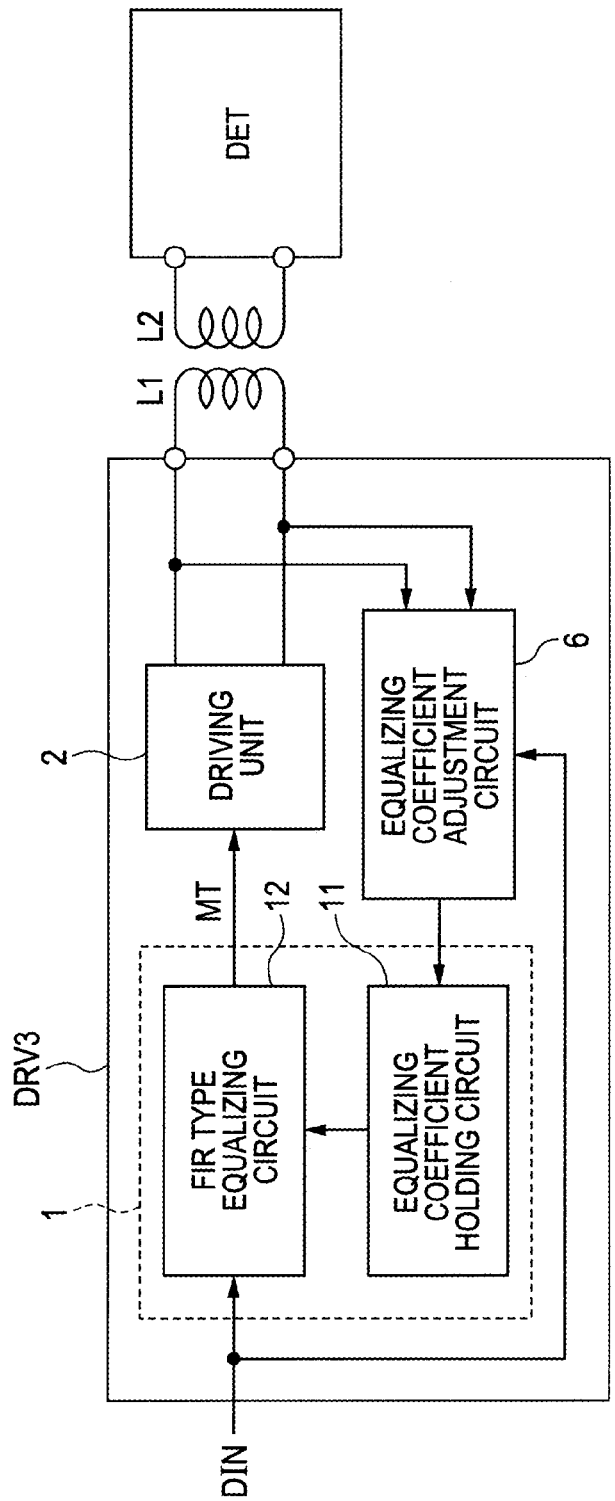
FIG. 18 is a block diagram of a driving circuit according to a third embodiment of the present invention.

In a third embodiment of the present invention, a driving circuit DRV3 that is a modification of the driving circuit DRV1 according to the first embodiment will be explained below. FIG. 18 is a block diagram of a driving circuit DRV3 according to the third embodiment. As shown in FIG. 18, the driving circuit DRV3 according to the third embodiment is a driving circuit that is equivalent to the driving circuit DRV1 to which an equalizing coefficient adjustment circuit 6 is added.

The equalizing coefficient adjustment circuit 6 adjusts compensation coefficients used in FIR type equalizing processing performed in an outgoing signal compensation unit 1 (for example, equalizing coefficients) on the basis of an output waveform of a driving unit 2 and an outgoing data DIN. In FIG. 18, the equalizing coefficient adjustment circuit 6 receives a driving waveform sent to an inductance L1 as a differential signal and the outgoing data DIN, and outputs, to the equalizing coefficient holding circuit 11, equalizing coefficients that are calculated and adjusted on the basis of the driving waveform and the outgoing data DIN.

Next, concrete adjustment processing of the equalizing coefficient adjustment circuit 6 will be explained. The equalizing coefficient adjustment circuit 6 adjusts the equalizing coefficients so that the mean square error between a value of the outgoing data DIN and outgoing data in a transmitting circuit obtained from a driving waveform of an inductor L1 becomes minimum. To put it concretely, the mean square error is reduced by repeatedly calculating the following Equations (2) to (4) at a data rate. Here, Equations (2) to (4) are used in the case where the equalizing processing is performed with the use of three pieces of the outgoing data DIN.

$$d = \mathrm{sign}[x(n), x(n-1), x(n-2)] \quad (2)$$

$$\mathrm{error} = \mathrm{sign}(DIN(n) - DOUT(n)) \quad (3)$$

$$w(n+1) = w(n) + \mu \times \mathrm{error} \times d \quad (4)$$

In Equation (2), d represents a variable, x represents a sign of the outgoing data, and n represents an order in which the outgoing data is sent. In Equation (2), a variable d is given by a sign function with three signs of three pieces of outgoing data DIN as its variables. In Equation (3), a differential error between the nth outgoing data DIN and nth incoming data DOUT output by a receiving circuit is calculated. In Equation (4), a difference obtained by subtracting a multiplication product of the variable d, the differential error and a coefficient adjusting coefficient μ from an equalizing coefficient w(n) repeatedly calculated n times is assigned to w(n+1) as an equalizing coefficient repeatedly calculated n+1 times. The above-described calculation method is referred to as a sign-sign least mean square error algorithm.

Figure 19:
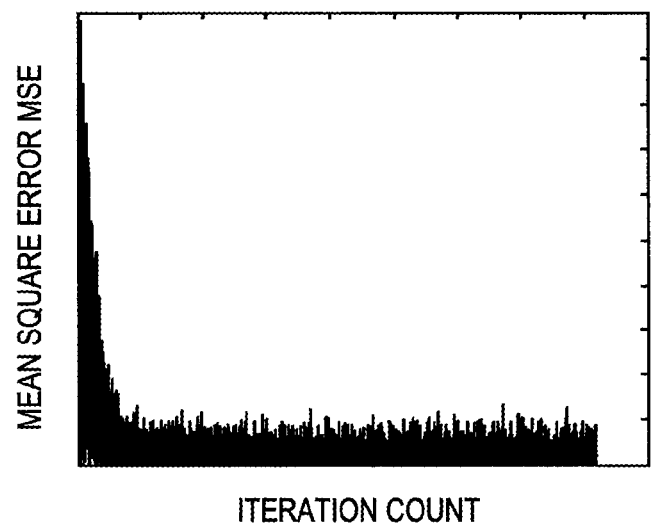
FIG. 19 is a graph showing a transitions of a mean square error obtained through compensation coefficient adjustment processing performed by the driving circuit according to the third embodiment.
Figure 20:
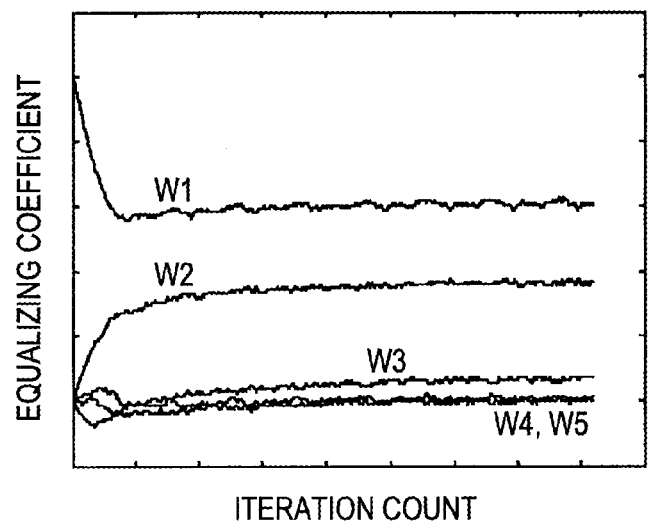
FIG. 20 is a graph showing transitions of compensation coefficients obtained through the compensation coefficient adjustment processing performed by the driving circuit according to the third embodiment.

A transition process of the mean square error repeatedly calculated as above by the sign-sign least mean square error algorithm is shown in FIG. 19. As shown in FIG. 19, the repeated calculation with the use of the sign-sign least mean square error algorithm reduces a mean square error between the outgoing data DIN and the incoming data DOUT corresponding to the outgoing data DIN. In addition, transition processes of the equalizing coefficients W1 to W5 in the case where Equations (2) to (4) are repeatedly calculated are shown in FIG. 20. As shown in FIG. 20, the equalizing coefficients W1 to W5 respectively converge to constant values.

As is clear from the above description, the equalizing coefficients can be set without calculating the equalizing coefficients in advance owing to the equalizing coefficient adjustment circuit 6. In addition, the equalizing coefficient adjustment circuit 6 makes it possible to properly change the equalizing coefficients even if it is necessary to change the equalizing coefficients in accordance with the condition of a communication system.

Fourth Embodiment

Figure 21:
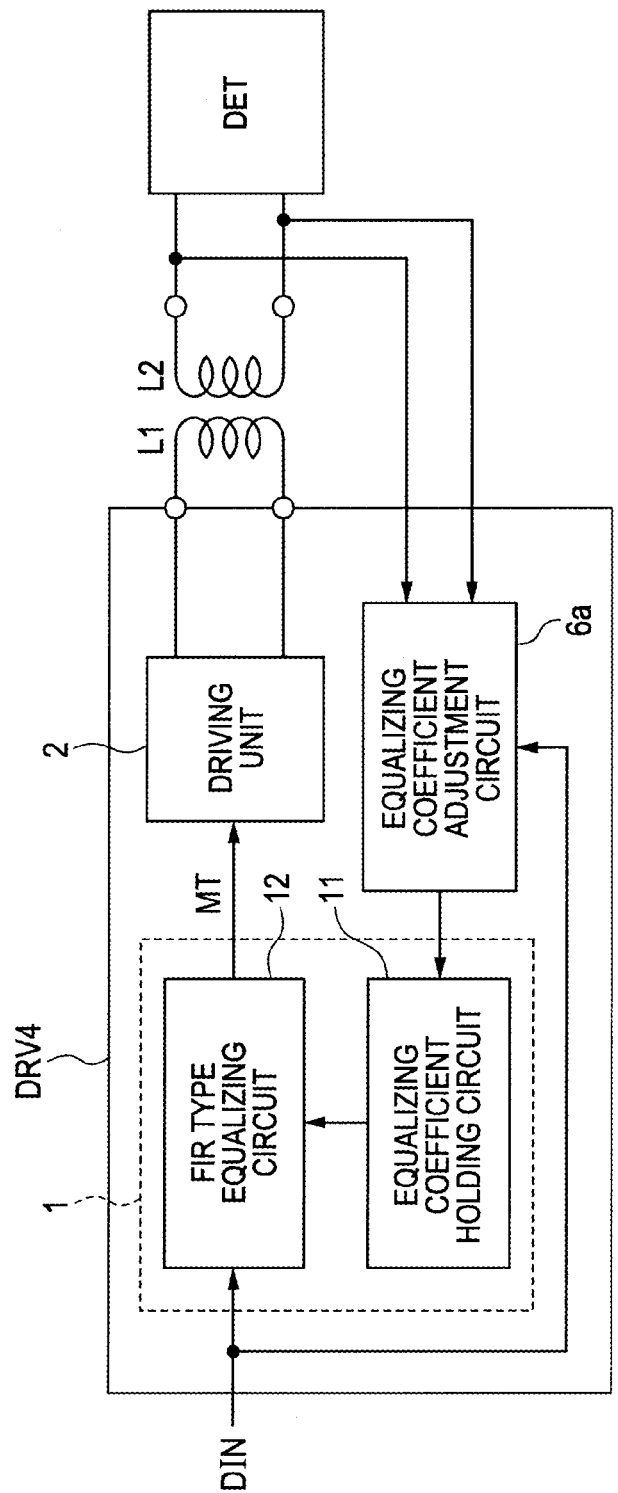
FIG. 21 is a block diagram of a driving circuit according to a fourth embodiment of the present invention.

In a fourth embodiment of the present invention, an equalizing coefficient adjustment circuit 6a that is a modification of the equalizing coefficient adjustment circuit 6 according to the third embodiment will be explained below. FIG. 21 is a block diagram of a driving circuit DRV4 including the equalizing coefficient adjustment circuit 6a. As shown in FIG. 21, the equalizing coefficient adjustment circuit 6a receives the waveform of an incoming signal generated across an inductor L2 instead of an output waveform of a driving unit. Because outgoing data DOUT can be regenerated in such a configuration of the driving circuit DRV4, the equalizing coefficient adjustment circuit 6a can perform a similar operation to the operation of the equalizing coefficient adjustment circuit 6.

In addition, a signal input into a receiving circuit can be fed via a wireless interface or a wire interface.

The configuration of the fourth embodiment is particularly useful in the case where a transmission delay between an inductor L1 and an inductor L2 is small, or the speed of updating the equalizing coefficients is slow. In addition, in the equalizing coefficient adjustment circuit 6a, the adjustment processing of the equalizing coefficients is performed with the use of the signal generated in the receiving circuit, which makes it possible to perform the adjustment more accurately.

Fifth Embodiment

Figure 22:
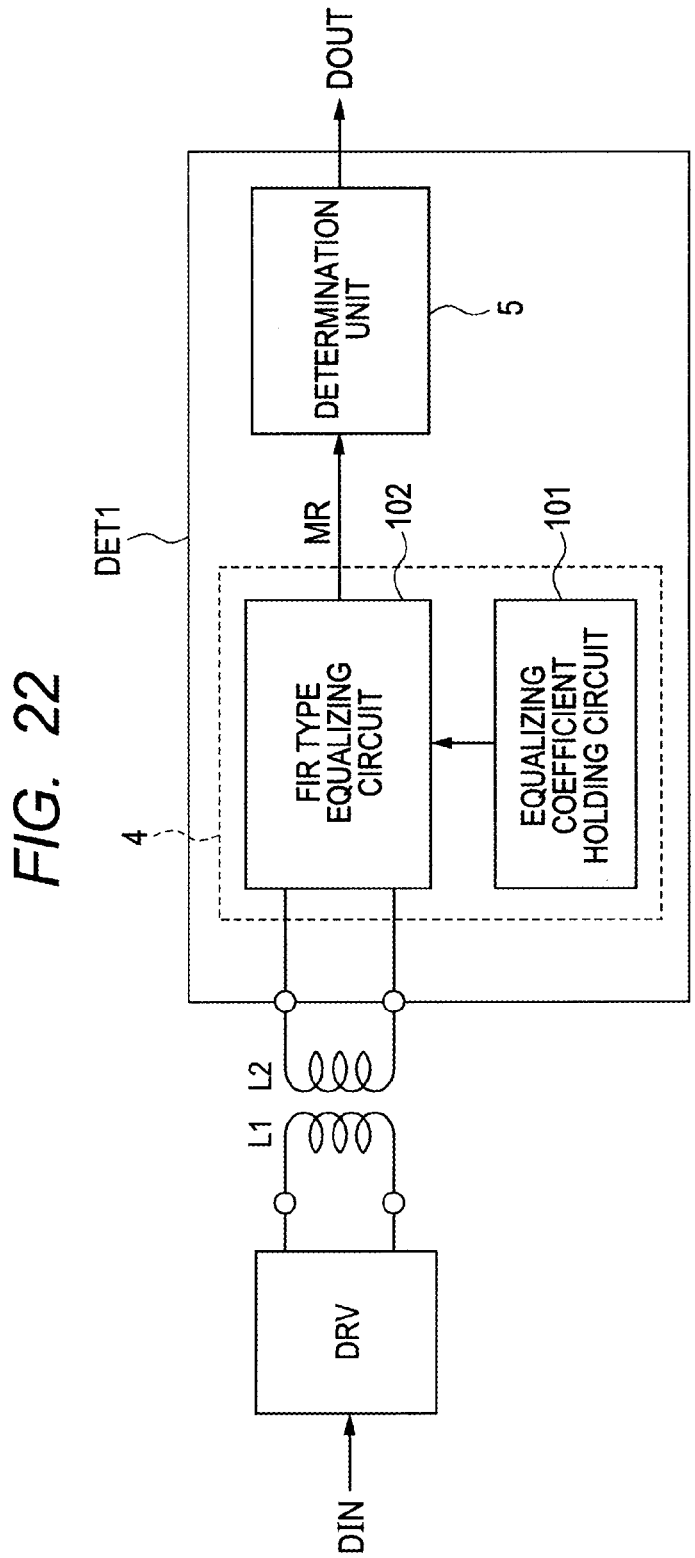
FIG. 22 is a block diagram of a determination circuit according to a fifth embodiment of the present invention.

In a fifth embodiment of the present invention, compensation of a waveform performed in a receiving circuit will be explained below. To put it concretely, the compensation is performed in a determination circuit DET1 of the receiving circuit in the fifth embodiment. FIG. 22 shows a block diagram of the determination circuit DET1. As shown in FIG. 22, the determination circuit DET1 includes an incoming signal compensation unit 4 and a determination unit 5.

The incoming signal compensation unit 4 compensates wave distortion of an incoming signal generated owing to self-resonances of inductors L1 and L2, and generates compensated incoming data. The speed of the compensation processing performed by the incoming signal compensation unit 4 is equal to the data rate of outgoing data DIN. The compensation processing performed in the incoming signal compensation unit 4 compensates the incoming signal on the basis of incoming signals for n cycles respectively received 1 cycle to n cycles before the incoming signal is received. To put it concretely, the following description will be made below. The incoming signal compensation unit 4 includes an equalizing coefficient holding circuit 101 and an FIR type filter circuit. Here, because compensation processing by a function of an FIR type filter (for example, equalizing processing) is performed in the FIR type filter circuit, the FIR type filter circuit will be referred to as an FIR type equalizing circuit 102 hereinafter. The equalizing coefficient holding circuit 101 holds equalizing coefficients used in the FIR type equaling circuit 102. In the fifth embodiment, it will be assumed that these equalizing coefficients are set in advance.

The determination unit 5 outputs incoming data DOUT after determining a logic level of the outgoing data DIN on the basis of the compensated incoming signal.

Figure 23:
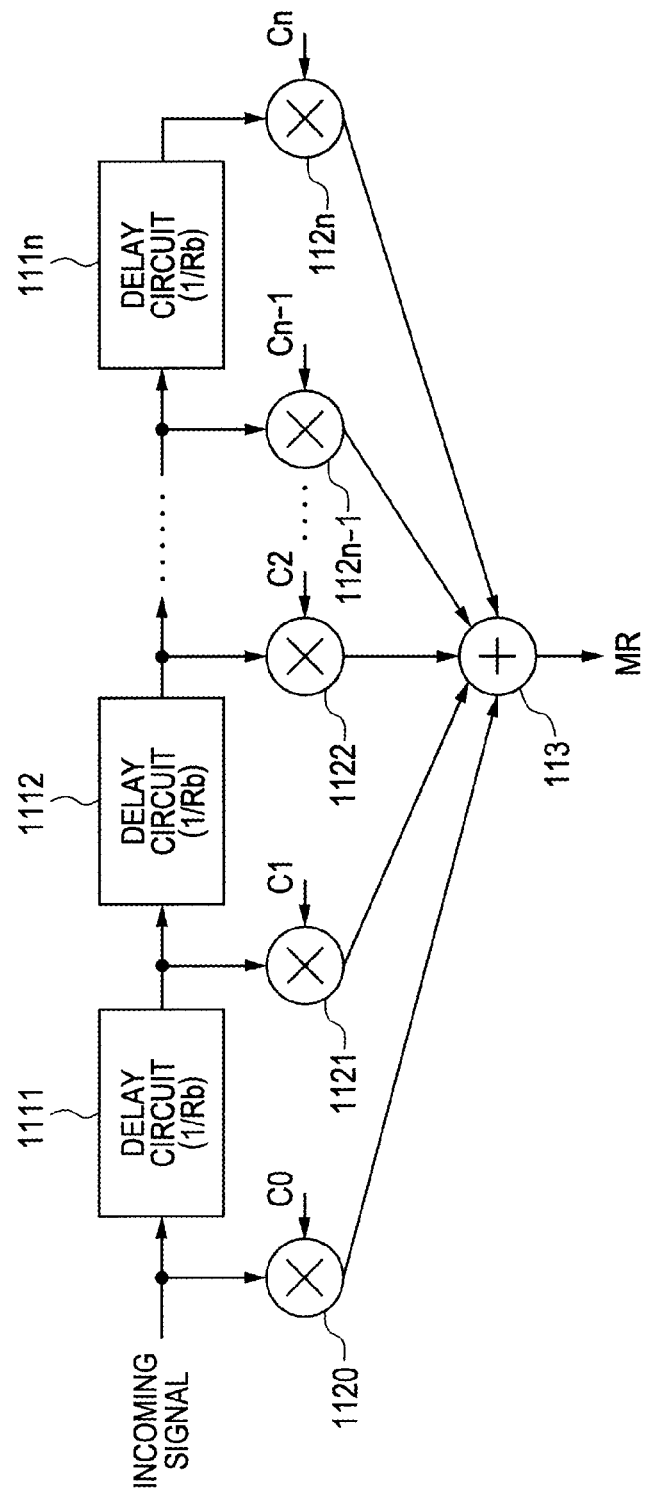
FIG. 23 is a conceptual diagram showing a processing principle of an incoming signal compensation unit according to the fifth embodiment.
Figure 24:
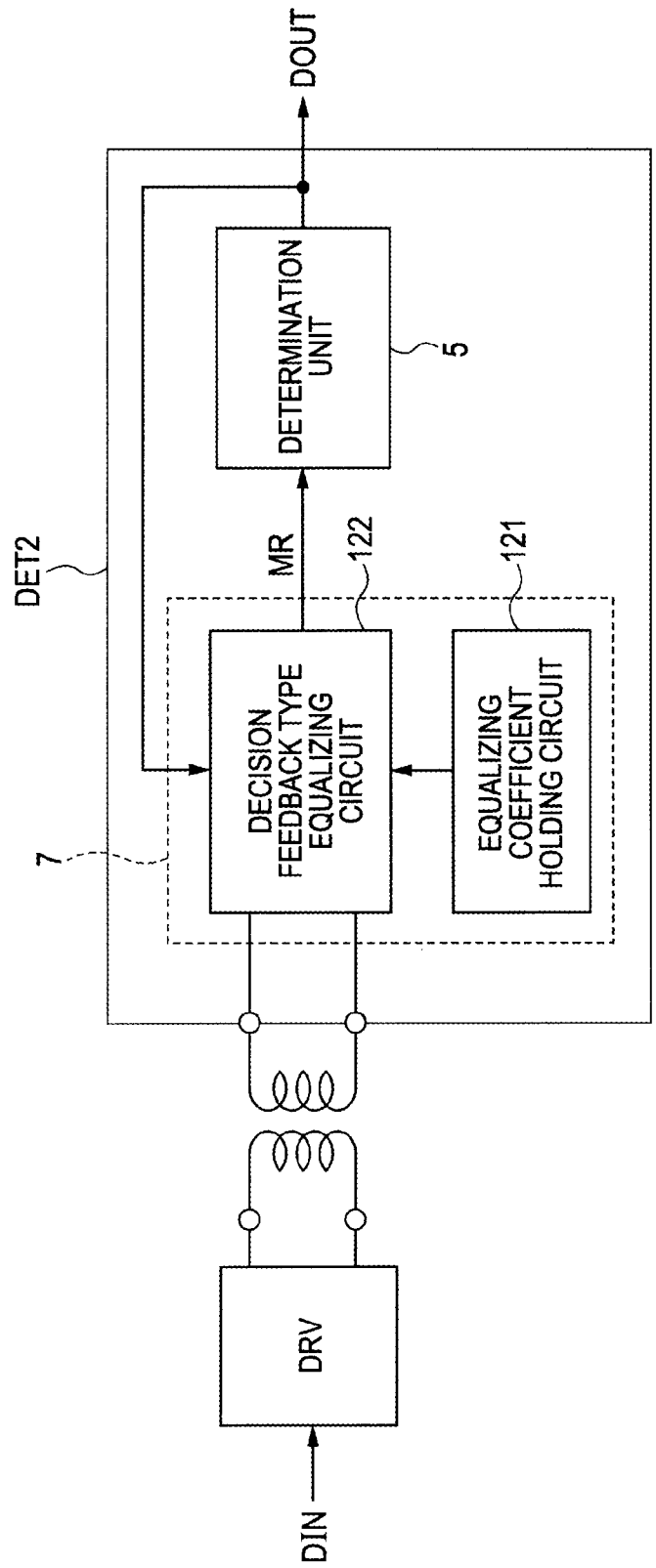
FIG. 24 is a block diagram of a determination circuit according to a sixth embodiment of the present invention.

Next, equalizing processing performed in the incoming signal compensation unit 4 will be concretely explained. A processing principle of the equalizing processing performed in the incoming signal compensation unit 4 is shown in FIG. 23. Here, in order to explain an operation principle of the equalizing processing, concrete circuits used for processes that are necessary for the equalizing processing are respectively shown in FIG. 23. As shown in FIG. 23, the equalizing processing, which is performed in the incoming signal compensation unit 4 according to the fifth embodiment, can be realized with the use of delay circuits 1111 to 111$n$, multipliers 1120 to 112$n$, and an adder 113.

The delay circuits 1111 to 111$n$ are coupled in series. In addition, each of the delay circuits 1111 to 111$n$ delays an incoming signal by a time period equivalent to the cycle of the data rate. Subsequently, each of the delay circuits 1111 to 111$n$–1 transmits the delayed incoming signal to the next delay circuit, (wherein the delay circuit 111$n$–1 is a delay circuit situated in front of the delay circuit 111$n$). The multiplier 1120 multiplies the input incoming signal by an equalizing coefficient C0, and outputs a multiplication product. The multipliers 1121 to 112$n$ respectively multiply the incoming data output by the delay circuits 1111 to 111$n$ by equalizing coefficients C1 to Cn, and output multiplication products. The adder 113 adds the multiplication products output by the multipliers 1120 to 112$n$ to generate the compensated incoming signal MR.

In other words, in the equalization processing, the incoming signals are delayed, and the incoming signals for n cycles are parallelized. Subsequently, the parallelized incoming signals are respectively multiplied by the equalizing coefficient C0 to Cn in anti-chronological order. The compensated incoming signal MR is obtained by adding n (wherein n represents the number of the incoming signals) incoming signals multiplied by the equalizing coefficient C0 to Cn in anti-chronological order.

The determination circuit DET1 according to the fifth embodiment determines a logic level of the outgoing data DIN on the basis of the incoming signal that the determination circuit DET1 receives as an analog signal. Accordingly, the incoming signal compensation unit 4 in the determination circuit DET1 includes analog circuits. To put it concretely, the delay circuits can be realized with resistors and capacitors. Amplifiers, which can vary their output capabilities in accordance with the equalizing coefficients respectively, can be used as the multipliers. In addition, the adder can be realized by coupling the outputs of the multipliers to a node.

Similarly to the case of the first embodiment, the distortion of the incoming signal can be compensated with the use of the FIR type equalizing filter mounted in this embodiment. In addition, the FIR type equalizing circuit 102 installed in the receiving circuit makes it possible to shorten a time period needed for the convergence of the amplitude of the compensated incoming signal MR in a similar way to the case of the first embodiment. In addition, with the use of the FIR type equalizing circuit, it becomes possible to prevent interference between a series of data.

Sixth Embodiment

In a sixth embodiment of the present invention, an incoming signal compensation unit that is different from the incoming signal compensation unit 4 used in the fifth embodiment will be explained below. A determination circuit according to the sixth embodiment of the present invention includes an incoming signal compensation unit 7 instead of the incoming signal compensation unit 4. In addition, in the incoming signal compensation unit 7, compensation processing is performed using a decision feedback equalizing circuit. The incoming signal compensation unit 7 includes an equalizing coefficient holding circuit 121 and a decision feedback equalizing circuit 122. The equalizing coefficient holding circuit 121 holds equalizing coefficients used in the decision feedback equalizing circuit 122.

The decision feedback equalizing circuit 122 compensates an incoming signal with the use of n pieces of incoming data DOUT respectively received n cycles to one cycle before the incoming signal is received, and outputs the compensated incoming signal MR. In other words, the decision feedback equalizing circuit 122 compensates the incoming signal on the basis of n pieces of incoming data respectively received n cycles to one cycle before the incoming signal is received.

Figure 25:
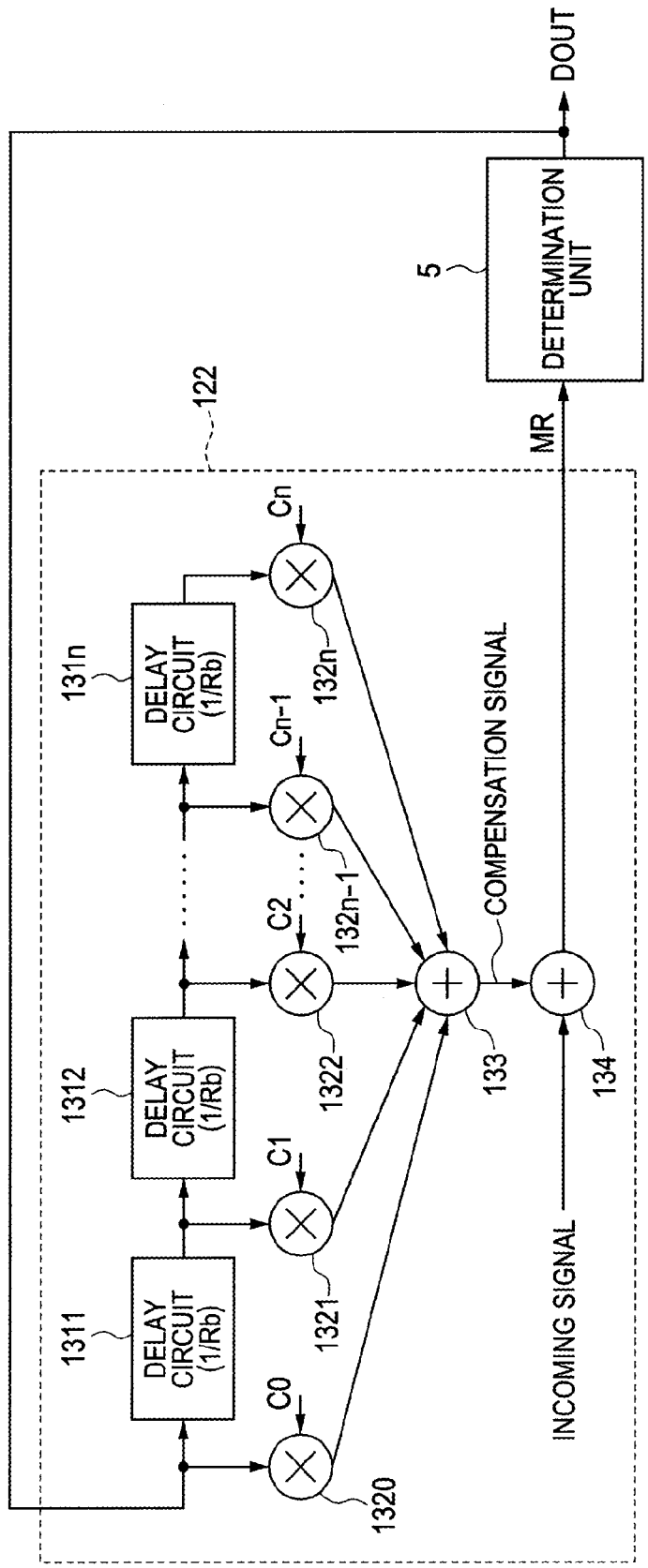
FIG. 25 is a conceptual diagram showing a processing principle of an incoming signal compensation unit according to the sixth embodiment.

Next, equalizing processing performed in the incoming signal compensation unit 7 will be concretely described below. A processing principle of the equalizing processing performed in the incoming signal compensation unit 7 is shown in FIG. 25. Here, in order to explain an operation principle of the equalizing processing, concrete circuits used for processes that are necessary for the equalizing processing are respectively shown in FIG. 25. As shown in FIG. 25, the equalizing processing, which is performed in the incoming signal compensation unit 7 according to the sixth embodiment, can be realized with the use of delay circuits 1311 to 131$n$, multipliers 1320 to 132$n$, and adders 113 and 134.

The delay circuits 1311 to 131$n$ are coupled in series. In addition, each of the delay circuits 1311 to 131$n$ delays the incoming data DOUT by a time period equivalent to the cycle of the data rate of the incoming data DOUT. Subsequently, each of the delay circuits 1311 to 131$n$–1 transmits the delayed incoming signal to the next delay circuit, (wherein the delay circuit 131$n$–1 is a delay circuit situated in front of the delay circuit 131$n$). The multiplier 1320 multiplies the input incoming signal by an equalizing coefficient C0, and outputs a multiplication product. The multipliers 1321 to 132$n$ respectively multiply the incoming data output by the delay circuits 1311 to 131*n* by equalizing coefficients C1 to Cn, and output multiplication products. The adder 133 adds the multiplication products output by the multipliers 1320 to 132*n* to output a compensation signal. The adder 134 adds the compensation signal and the incoming signal to generate the compensated incoming signal MR.

In other words, in the decision feedback equalization processing, the incoming data DOUT is delayed, and the incoming signals for n cycles are parallelized. Subsequently, the parallelized incoming data DOUT is respectively multiplied by the equalizing coefficient C0 to Cn in anti-chronological order. Next, the compensation signal is generated by adding n pieces of incoming data DOUT (wherein n represents the number of the incoming data pieces) multiplied by the equalizing coefficient C0 to Cn in anti-chronological order. The compensated incoming signal MR is obtained by adding the compensation signal and the incoming signal.

A determination circuit DET2 according to the sixth embodiment generates a compensation value using an incoming data DOUT output as a digital signal. Therefore, the configuration including delay circuits, multipliers, an adder, and the like except for the adder 134 is the same as the configuration according to the first embodiment (for example, the configuration shown in FIG. 8).

Figure 26:
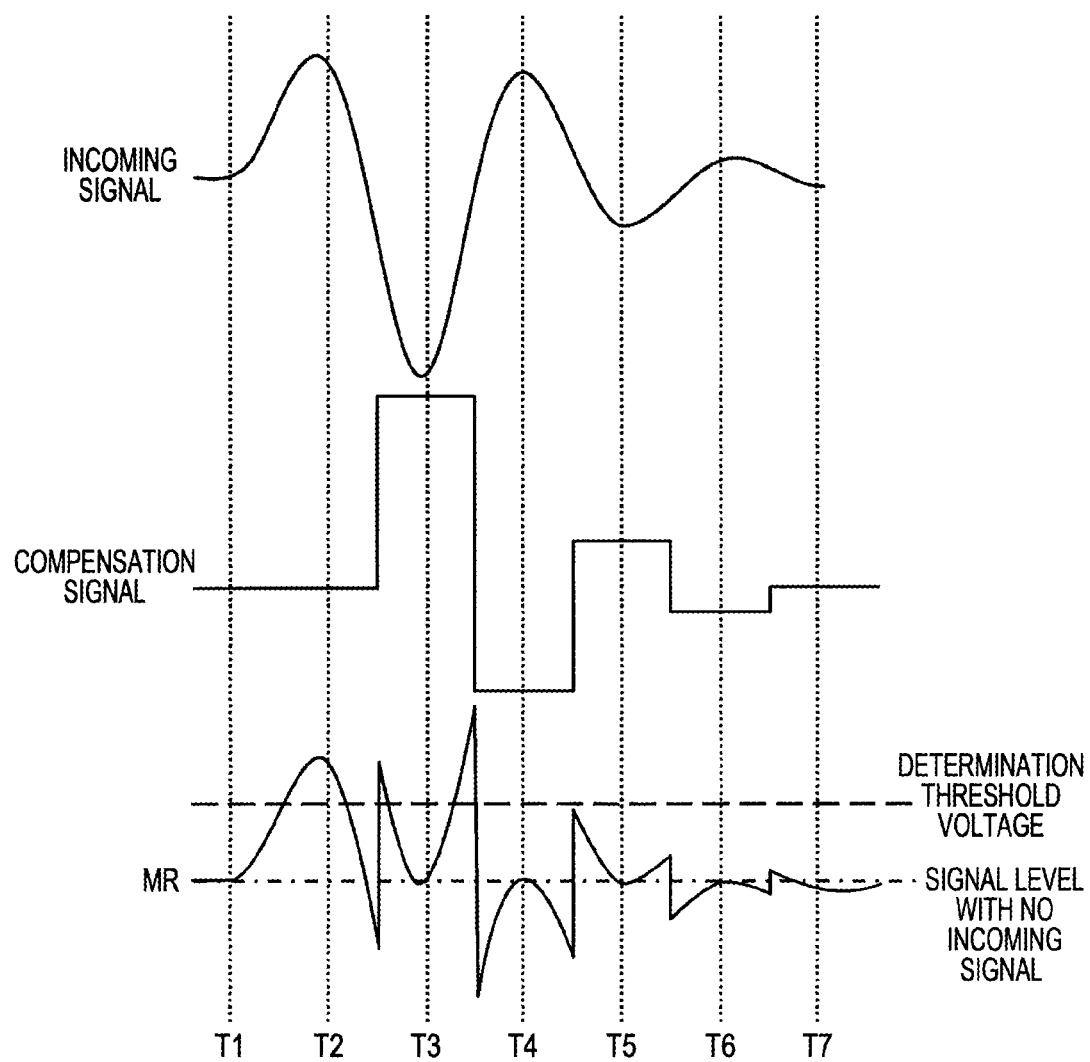
FIG. 26 is waveforms obtained through wave compensation processing with the use of decision feedback equalizing processing according to the sixth embodiment.

Next, the outline of waveform compensation performed by the equalizing processing of the decision feedback equalizing circuit will be explained below. An incoming signal, the waveforms of a compensation signal, and a compensated incoming signal MR in the decision feedback equalizing circuit are shown in FIG. 26. As shown in FIG. 26, the incoming signal is not a dicode signal. The compensation signal is generated as a waveform including plural rectangular waves respectively corresponding to the peaks of the incoming signal except for the first peak of the incoming signal. The compensated incoming signal MR becomes a signal that has plural peaks with their magnitudes constrained except for its first peak. Therefore, a logical level of the incoming data DOUT can be determined by determining the incoming signal at the timing T2 when its first peak is generated. In the example shown in FIG. 26, a signal level of the incoming signal at the timing T2 is larger than a determination threshold voltage, while signal levels of the incoming signal are almost the same as signal levels with no incoming signal at all other timings.

Figure 27:
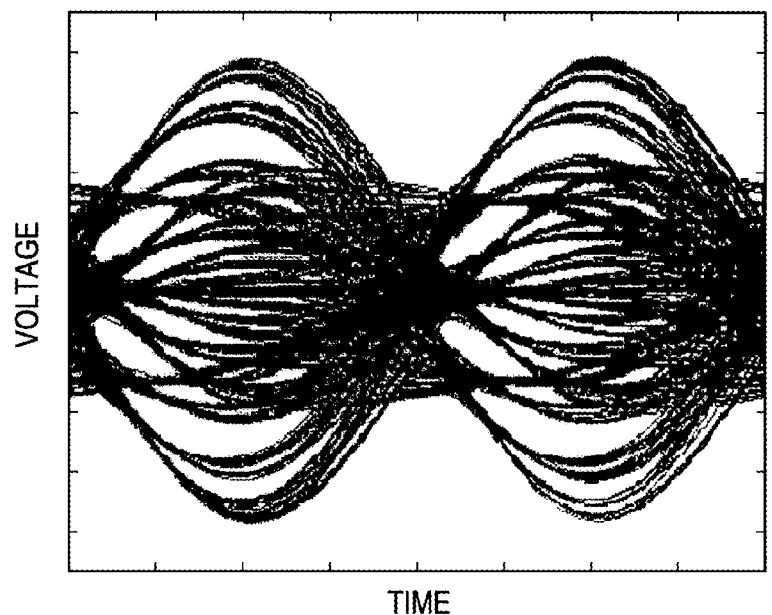
FIG. 27 is a diagram showing eye patterns of an incoming signal in the case where compensation processing is not performed.
Figure 28:
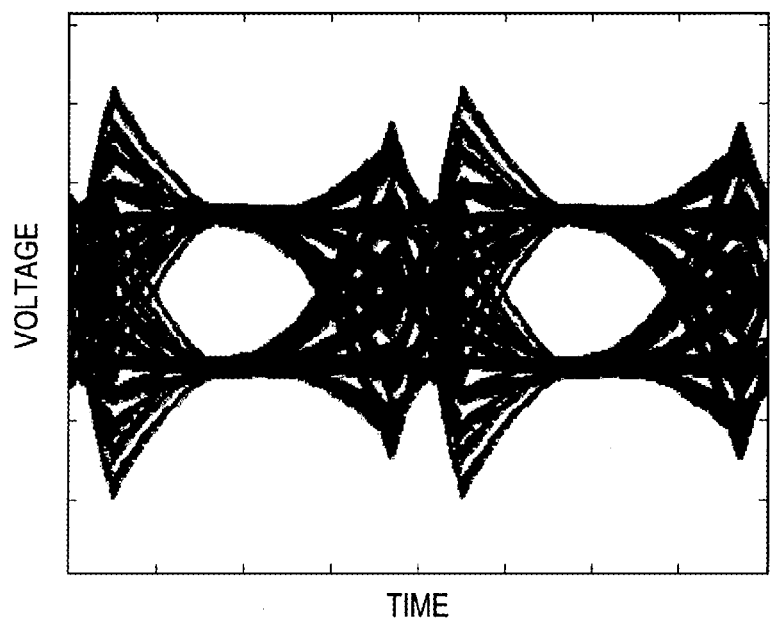
FIG. 28 is a diagram showing eye patterns of an incoming signal in the case where compensation processing with the use of decision feedback equalizing processing is performed.

Next, the effect of the compensation processing will be explained with the use of eye patterns of an incoming signal. FIG. 27 shows eye patterns of an incoming signal in the case where the compensation processing is not performed. FIG. 28 shows eye patterns of an incoming signal in the case where the compensation processing is performed with the use of the decision feedback equalizing circuit 122. The eye patterns shown in FIG. 27 and FIG. 28 are obtained from an incoming signal input into a determination unit 5.

The eye patterns in FIG. 27 are corrupted owing to the distortion of the waveform of the incoming signal. It is difficult for the determination circuit to determine the characteristics of such a signal. On the other hand, in FIG. 28, the distortion of the waveform of an incoming signal is compensated, and eye patterns become large, so that the level of the incoming signal can be easily determined. As shown in FIG. 28, after the compensation processing is performed on the incoming signal by the decision feedback equalizing circuit 122, the compensated incoming signal MR becomes a binary signal.

As described above, also with the use of the decision feedback equalizing circuit 122, it is possible to compensate waveform distortion of the amplitude of an incoming signal, and shorten a time period needed for the convergence of the incoming signal. Similarly to the other embodiments, in this embodiment of the present invention, it is possible to prevent interference between a series of outgoing data, and realize a high-speed communication without being subject to limitation owing to the self-resonance frequencies of inductors L1 and L2.

Seventh Embodiment

Figure 29:
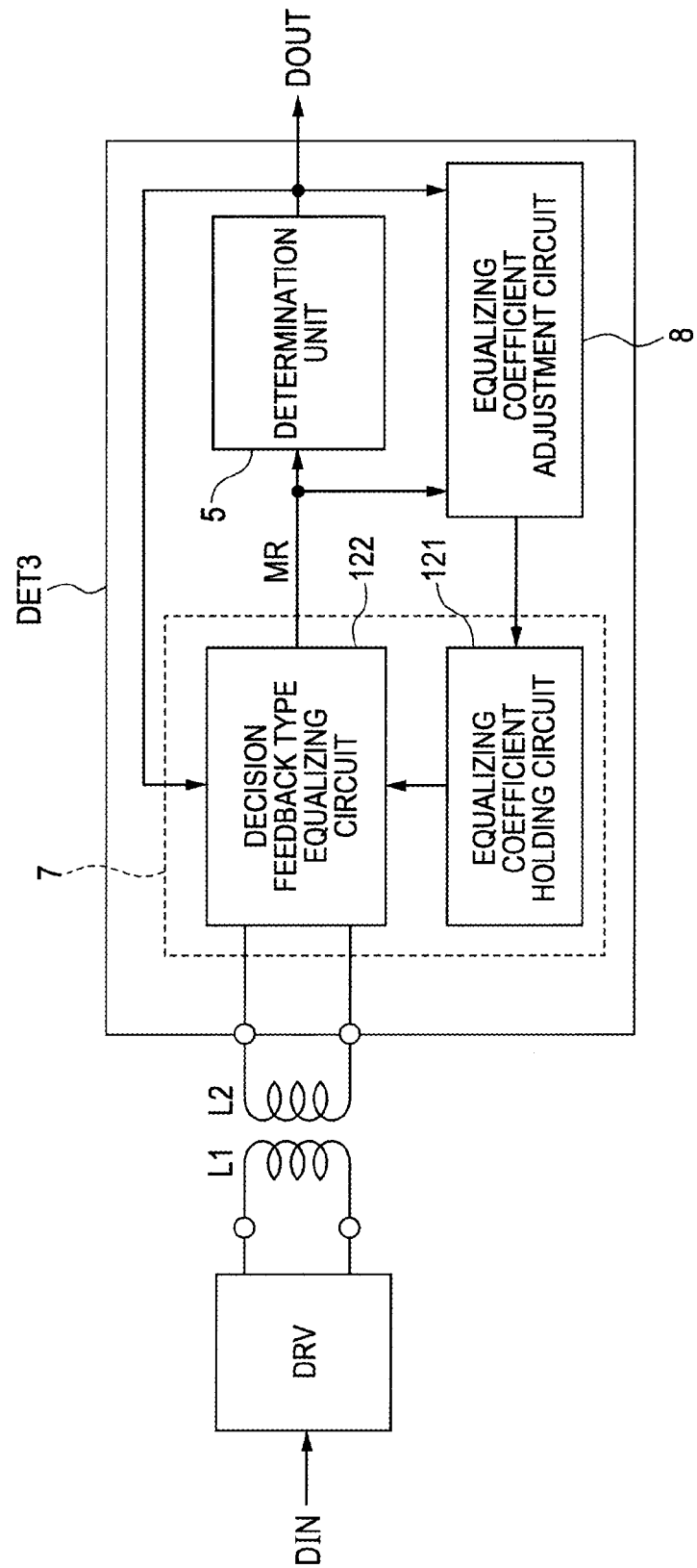
FIG. 29 is a block diagram of a determination circuit according to a seventh embodiment of the present invention.

In a seventh embodiment of the present invention, a modification of the determination circuit DET2 according to a sixth embodiment will be explained below. FIG. 29 is a block diagram of a determination circuit DET3 according to the seventh embodiment of the present invention. As shown in FIG. 29, the determination circuit DET3 according to the seventh embodiment is a determination circuit that is equivalent to the determination circuit DET2 to which an equalizing coefficient adjustment circuit 8 is added.

The equalizing coefficient adjustment circuit 8 adjusts compensation coefficients used in decision feedback equalizing processing performed in an incoming signal compensation unit 7 (for example, equalizing coefficients) on the basis of an incoming data DOUT output from a determination unit 5 and a waveform of the compensated incoming signal MR output from a decision feedback equalizing circuit.

Concrete adjustment processing performed by the equalizing coefficient adjustment circuit 8 will be explained below. The equalizing coefficient adjustment circuit 8 adjusts the equalizing coefficients so that the mean square error between incoming data obtained from a waveform of the compensated incoming signal MR and incoming data DOUT becomes minimum. To put it concretely, the mean square error is reduced by repeatedly calculating the following Equations (5) to (7) at the data rate. Here, Equations (5) to (7) are used in the case where the equalizing processing is performed with the use of three pieces of the incoming data DOUT.

$$d = \text{sign}[y(n), y(n-1), y(n-2)] \quad (5)$$

$$\text{error} = \text{sign}(DOUT(n) - MR(n)) \quad (6)$$

$$w(n+1) = w(n) + \mu \times \text{error} \times d \quad (7)$$

In Equation (5), d represents a variable, y represents a sign of the incoming data, and n represents an order in which the incoming data are received. In Equation (5), a variable d is given by a sign function with three signs of three pieces of incoming data DOUT as its variables. In Equation (6), a differential error between the nth incoming data MR and nth incoming data DOUT is calculated. In Equation (7), a difference obtained by subtracting a multiplication product of the variable d, the differential error and a coefficient adjusting coefficient μ from an equalizing coefficient w(n) repeatedly calculated n times is assigned to w(n+1) as an equalizing coefficient repeatedly calculated n+1 times. The above-described calculation method is referred to as a sign-sign least mean square error algorithm.

As is clear from the above description, the equalizing coefficients can be set without calculating the equalizing coefficients in advance owing to the equalizing coefficient adjustment circuit 8. In addition, the equalizing coefficient adjustment circuit 8 makes it possible to properly change the equalizing coefficients even if it is necessary to change the equalizing coefficients in accordance with the condition of a communication system.

Eighth Embodiment

Figure 30:
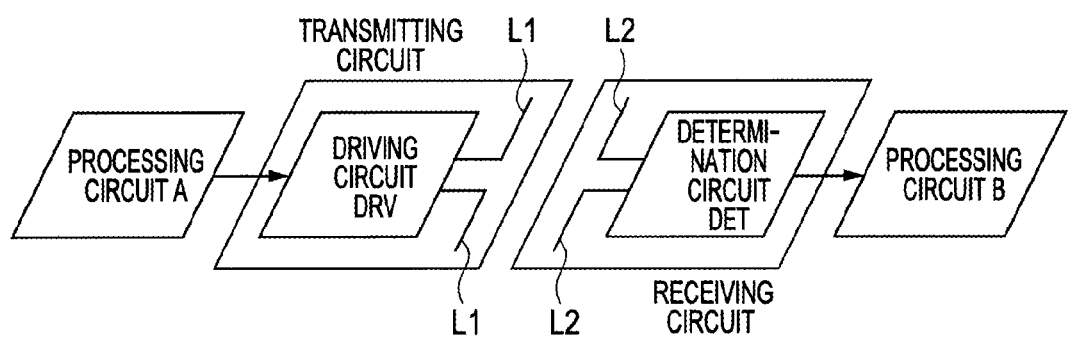
FIG. 30 is a block diagram of a communication system according to an eighth embodiment of the present invention.

In an eighth embodiment of the present invention, another type of inductors L1 and L2 will be explained below. FIG. 30 is a block diagram of a communication system in which another type of inductors L1 and L2 are used. As shown in FIG. 30, unlike the above-described inductors, the inductances L1 and L2 according to the eighth embodiment are not formed by wires of loop pattern but formed by wires with their ends open. An equivalent circuit of the inductors L1 and L2 of the above pattern is shown in FIG. 31.

Figure 31:
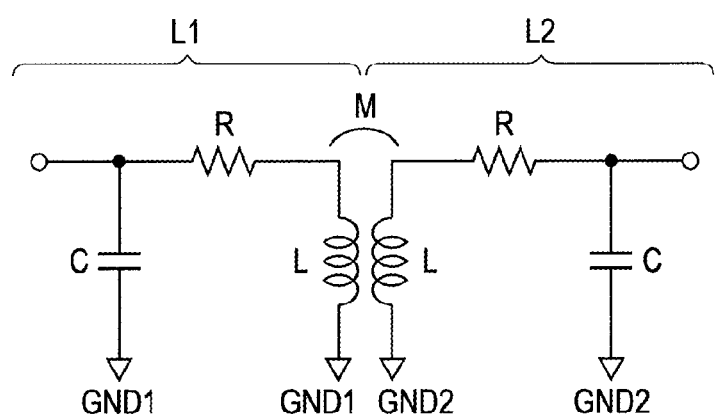
FIG. 31 is an equivalent circuit of inductors according to the eighth embodiment of the present invention.

As shown in FIG. 31, the equivalent circuit of the inductors L1 includes an inductance L and a wiring resistor R in series, and a parasitic capacity C coupled between the wiring resistor and ground. The same can be said for the equivalent circuit of the inductors L2. In addition, when the inductors L1 and L2 are in a close proximity to each other, they have magnetic coupling therebetween, that is, mutual inductance M is generated between the inductors L1 and L2. As long as the inductors L1 and L2 has shapes or figures that generates magnetic coupling that enables wireless communication between them, it can be said that these inductors can be applied to various embodiment of the present invention.

Other Embodiments

Figure 32:
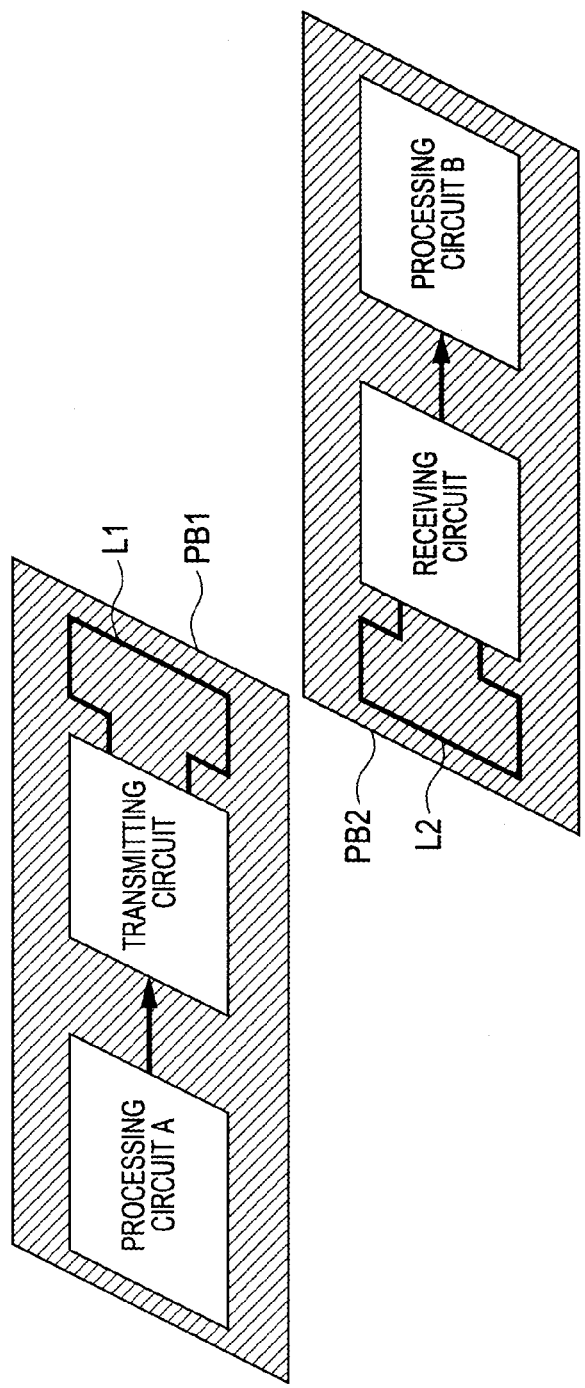
FIG. 32 is a block diagram showing a mounting example of a transmitting circuit and a receiving circuit according to another embodiment of the present invention.

In other embodiments of the present invention, mounting configurations of transmitting circuits and receiving circuits according to other embodiments will be explained below. FIG. 32 is a block diagram showing a mounting example of a transmitting circuit and a receiving circuit according to another embodiment of the present invention.

In FIG. 32, a transmitting circuit and a processing circuit A are mounted on a printed-circuit board PB1. In addition, a wiring that constitutes an inductor L1 is also printed on the printed-circuit board PB1, and this inductor L1 is driven by the transmitting circuit. A receiving circuit and a processing circuit B are mounted on a printed-circuit board PB2. In addition, a wiring that constitutes an inductor L2 is also printed on the printed-circuit board PB2, and the receiving circuit receives an incoming signal via this inductor L2.

In other words, in FIG. 32, the transmitting circuit and the receiving circuit are respectively formed on different semiconductor substrates, so that they are insulated from each other. In addition, the inductors L1 and L2 are respectively mounted as external components for the transmitting circuit and the receiving circuit.

The above-described mounting configuration can be used as an interface between a semiconductor memory device such as a flash memory and a processing device that utilizes the above semiconductor memory device. In this mounting configuration, semiconductor memory devices such as a flash memory are formed on one of the processing circuit A and the processing circuit B, and a personal computer or the like is formed on the other.

In addition, plural signal transmission routes can be established by installing plural transformers including inductors, plural transmitting circuits and plural receiving circuits, in which plural inductors provide interfaces between the plural transmitting circuits and the plural receiving circuits. The interfaces configured as above make it possible to replace interfaces, which are now available and have plural terminals, by wireless interfaces. Here, because the data rate of a transmitting circuit or a receiving circuit according to an embodiment of the present invention is not subject to limitation owing to the self-resonance frequencies of the inductors, the data rate of the related interface can be easily matched with the data rate of the wireless interface according to the embodiment of the present invention. In other words, a wireless interface incompliant with the related interface can be utilized with specifications of the related interface kept as they are.

In addition, the mounting configuration shown in FIG. 32 can be used for a mobile terminal such as a cellular phone. For example, an interface between a mobile terminal and another device can be established, for example, by installing the printed-circuit board PB1, on which the transmitting circuit is mounted, in a cellular phone and by installing the printed-circuit board PB2, on which the receiving circuit is mounted, in another terminal.

Figure 33:
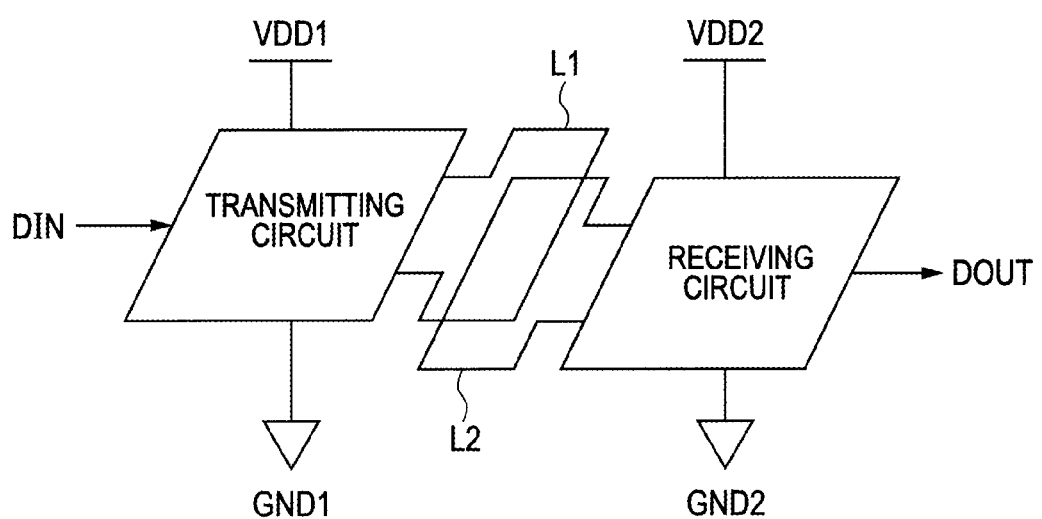
FIG. 33 is a block diagram showing a mounting example of a transmitting circuit and a receiving circuit according to another embodiment of the present invention.

FIG. 33 is a block diagram showing a mounting example of a transmitting circuit and a receiving circuit in the case where a power supply voltage at which the transmitting circuit operates and a power supply voltage at which the receiving circuit operates are different from each other. In the case where the power supply voltage for the transmitting circuit and the power supply voltage for the receiving circuit are different from each other as shown in FIG. 33, it is desirable that the transmitting circuit and the receiving circuit are insulated from each other. If two circuits that operate at different power supply voltages are coupled to each other without insulation, an adverse current may occur in one circuit or the other of the two circuits owing to the difference between these power supply voltages. As a method to insulate the transmitting circuit and the receiving circuit from each other, a method to form the transmitting circuit and the receiving circuit respectively in different semiconductor devices, a method to form the transmitting circuit and the receiving circuit respectively on different areas insulated from each other in the same semiconductor chip, or the like are conceivable. Although there is a problem in that signal transmission between circuits insulated from each other cannot be established by simple coupling, it can be established via a wireless interface that utilizes magnetic coupling between inductors. In addition, in the transmitting circuit and the receiving circuit according to the above-described embodiments of the present invention, even if the above circuits are insulated from each other, the speed of communication can be kept high because the data rate is not subject to limitation owing to the self-resonance frequencies of the inductors.

In addition, the present invention is not limited to the above-described embodiments, and proper modifications may be made to the above-described embodiments without departing from the spirit and scope of the present invention. For example, the above-described precoder and equalizing compensation circuits can be applied to all the above-described embodiments.

As described above, the embodiments of the present invention have been described under the assumption that the communication is performed in the case where the data rate Rb, that is, the reciprocal of the pulse transmission duration is set higher than any of the self-resonant frequencies of the inductor L1 and inductor L2. In addition, it is preferable that the self-resonant frequencies of the inductor L1 and inductor L2 are formed to be almost equal to each other. However, if the self-resonant frequencies of the inductor L1 and inductor L2 are different from each other to some extent, because the waveform of an incoming signal is determined by the self-resonant frequency of the inductor L2, it is better to set the data rate used for the communication higher than the self-resonant frequency of the inductor L2.

What is claimed is:

1. A transmitting circuit for transmitting data with the use of electromagnetic induction generated by driving by an inductor, comprising:

a driving circuit comprising:
an outgoing signal compensation unit that receives an outgoing data, performs a compensation processing on the outgoing data and outputs a compensated outgoing data; and
a driving unit that receives the compensated outgoing data and outputs an outgoing signal that drives the inductor,
wherein the data rate of the outgoing data is higher than a self-resonant frequency of the inductor and
wherein the compensation processing is performed as preventing an interference between data symbols from occurring on the outgoing signal.

2. The transmitting circuit according to claim 1, wherein the outgoing signal compensation unit that compensates wave distortion of the outgoing data generated owing to the self-resonance of the inductor, and outputs the compensated outgoing data to the driving unit.

3. The transmitting circuit according to claim 2, wherein the outgoing signal compensation unit compensates the wave distortion generated owing to the self-resonance of the inductor with the use of a rate equivalent to the data rate.

4. The transmitting circuit according to claim 3, wherein the outgoing signal compensation unit compensates outgoing data targeted for transmission with the use of n pieces of outgoing data respectively sent 1 cycle to n (wherein n represents a positive integer) cycles before the outgoing data targeted for transmission is sent.

5. The transmitting circuit according to claim 4, wherein the outgoing signal compensation unit compensates the outgoing data with the use of FIR type filtering.

6. The transmitting circuit according to claim 5, further comprising a coefficient adjusting circuit that adjusts compensation coefficients used for the FIR filtering, which is performed by the outgoing signal compensation unit, on the basis of the output waveform of the driving circuit or the incoming signal waveform on another semiconductor chip other than a semiconductor chip on which the transmitting circuit is mounted, and on the basis of the outgoing data.

7. The transmitting circuit according to claim 1, further comprising a precoder circuit that modulates the outgoing data with the use of a transmission function that cancels a transmission function from the input stage of the driving circuit to a determination circuit, which is mounted on the another semiconductor chip, that generates outgoing data from an incoming signal, the precoder outputting the modulated outgoing data to the driving circuit.

8. The transmitting circuit according to claim 1, wherein the inductor is formed on the same semiconductor substrate on which the driving circuit is formed on.

9. A transmitting circuit for transmitting data with the use of electromagnetic induction generated by driving by an inductor, comprising:
a driver configured by hardware circuitry to:
  receive an outgoing data;
  perform a compensation processing on the outgoing data having a data rate higher than a self-resonant frequency of the inductor;
  generate an outgoing signal based on the compensated outgoing data; and
  drive the inductor based on the outgoing signal,
wherein the compensation processing is performed as preventing an interference between data symbols from occurring on the outgoing signal.

* * * * *